United States Patent
Adams

(10) Patent No.: US 10,784,024 B2
(45) Date of Patent: Sep. 22, 2020

(54) WIRE-DRAWING METHOD AND SYSTEM

(71) Applicant: Ultra Conductive Copper Company, Inc., Lexington, MA (US)

(72) Inventor: Horst Jakob Adams, Houston, TX (US)

(73) Assignee: Ultra Conductive Copper Company, Inc., Lexington, MA (US)

( * ) Notice: Subject to any disclaimer, the term of this patent is extended or adjusted under 35 U.S.C. 154(b) by 366 days.

(21) Appl. No.: 15/691,047

(22) Filed: Aug. 30, 2017

(65) Prior Publication Data

US 2019/0066882 A1    Feb. 28, 2019

(51) Int. Cl.

| | |
|---|---|
| *H01B 13/02* | (2006.01) |
| *C23C 16/26* | (2006.01) |
| *C23C 16/50* | (2006.01) |
| *B21C 1/20* | (2006.01) |
| *B21C 3/02* | (2006.01) |
| *H01B 13/00* | (2006.01) |
| *B21C 1/30* | (2006.01) |
| *H01B 1/04* | (2006.01) |
| *H01B 1/02* | (2006.01) |

(52) U.S. Cl.
CPC .......... *H01B 13/0264* (2013.01); *B21C 1/30* (2013.01); *B21C 3/02* (2013.01); *C23C 16/26* (2013.01); *C23C 16/50* (2013.01); *H01B 1/02* (2013.01); *H01B 1/026* (2013.01); *H01B 1/04* (2013.01); *H01B 13/0003* (2013.01)

(58) Field of Classification Search
CPC ........ H01B 13/0264; H01B 1/04; H01B 1/02; H01B 1/026; H01B 13/0003; C23C 16/26; C23C 16/50; B21C 1/30; B21C 3/02
See application file for complete search history.

(56) References Cited

U.S. PATENT DOCUMENTS

| | | |
|---|---|---|
| 2011/0226509 A1 | 9/2011 | Kim et al. |
| 2014/0272199 A1 | 9/2014 | Lin et al. |
| 2015/0194241 A1 | 7/2015 | Tanielian |
| 2017/0339787 A1 | 11/2017 | Braley et al. |

FOREIGN PATENT DOCUMENTS

| | | |
|---|---|---|
| CN | 107403656 A | 11/2017 |
| EP | 2814040 A1 | 12/2014 |
| EP | 3252778 A1 | 12/2017 |
| JP | 2009138306 * | 6/2009 |
| WO | WO 2016/094244 A1 | 6/2016 |

OTHER PUBLICATIONS

Che et al., "Retained Carrier-Mobility and Enhanced Plasmonic-Photovoltaics of Graphene via ring-centered $\eta^6$ Functionalization and Nanointerfacing," *Nano Letters*, 17(7): 4381-4389 (Jun. 6, 2017).

Polsen et al., "High-speed roll-to-roll manufacturing of graphene using a concentric tube CVD reactor," *Scientific reports*, 5: 1-12, article No. 10257 (May 21, 2015).

* cited by examiner

*Primary Examiner* — John C Hong
(74) *Attorney, Agent, or Firm* — Leydig, Voit & Mayer, Ltd.

(57) ABSTRACT

A wire-drawing method comprises providing a rod comprising a wrapped sheet, wherein the sheet comprises a plurality of copper layers and a plurality of graphene layers; extracting an inner layer of the wrapped sheet from the rod to form a spiral; and forming a wire by feeding the spiral through an opening of a die unit.

20 Claims, 24 Drawing Sheets providing a copper foil having a first surface side and a second surface side opposite the first surface side, wherein the copper foil has a thickness of less than 25 μm; and ⎯ S10 depositing a first graphene layer on the first surface side of the copper foil and a second graphene layer on the second surface side of the copper foil. ⎯ S12

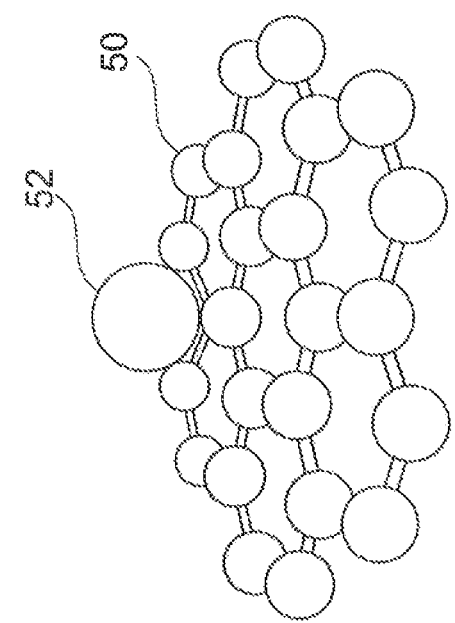
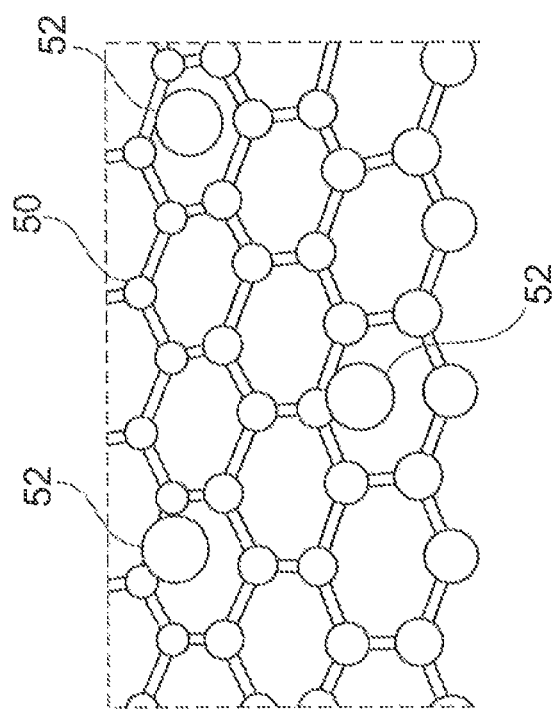
Fig. 11b
Fig. 11a

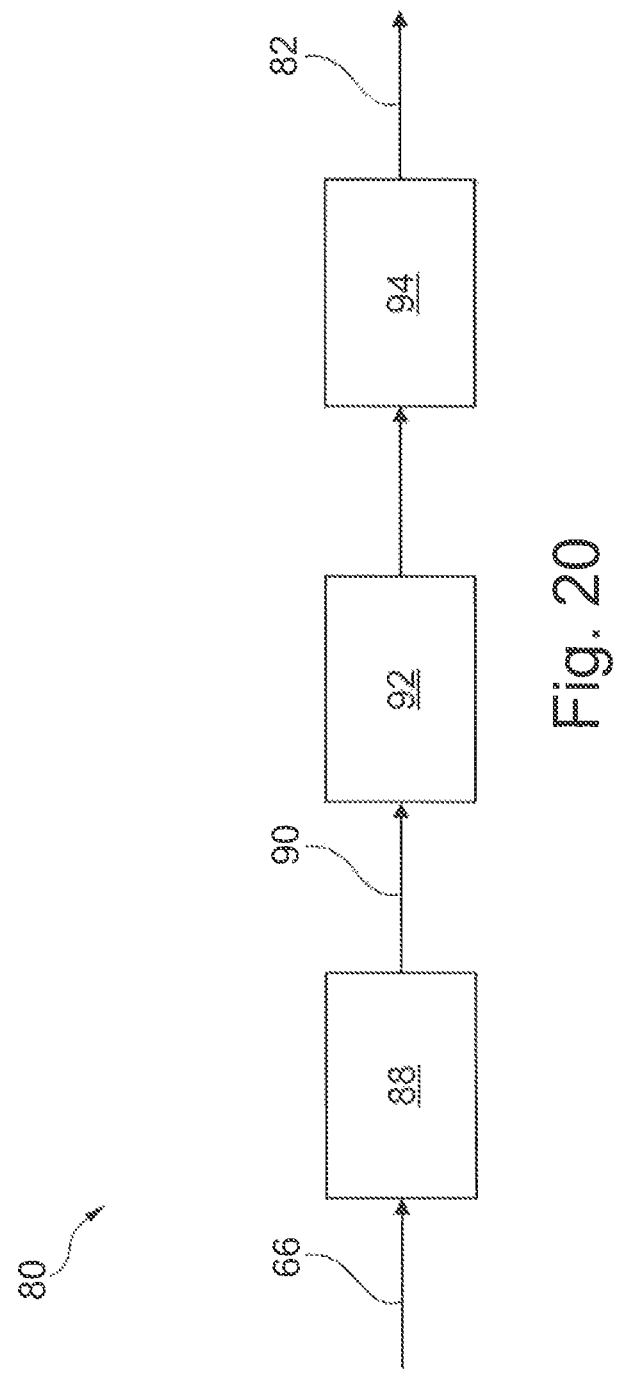

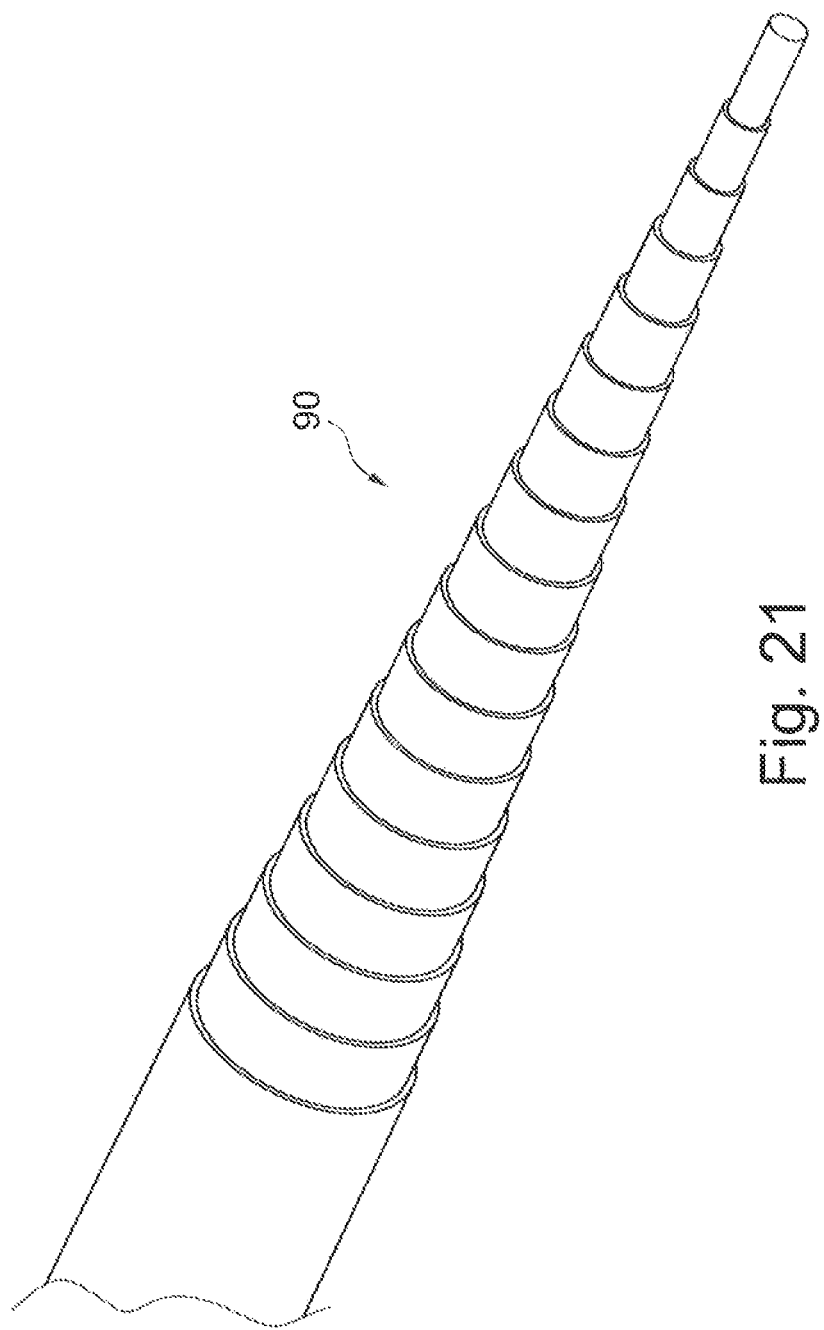

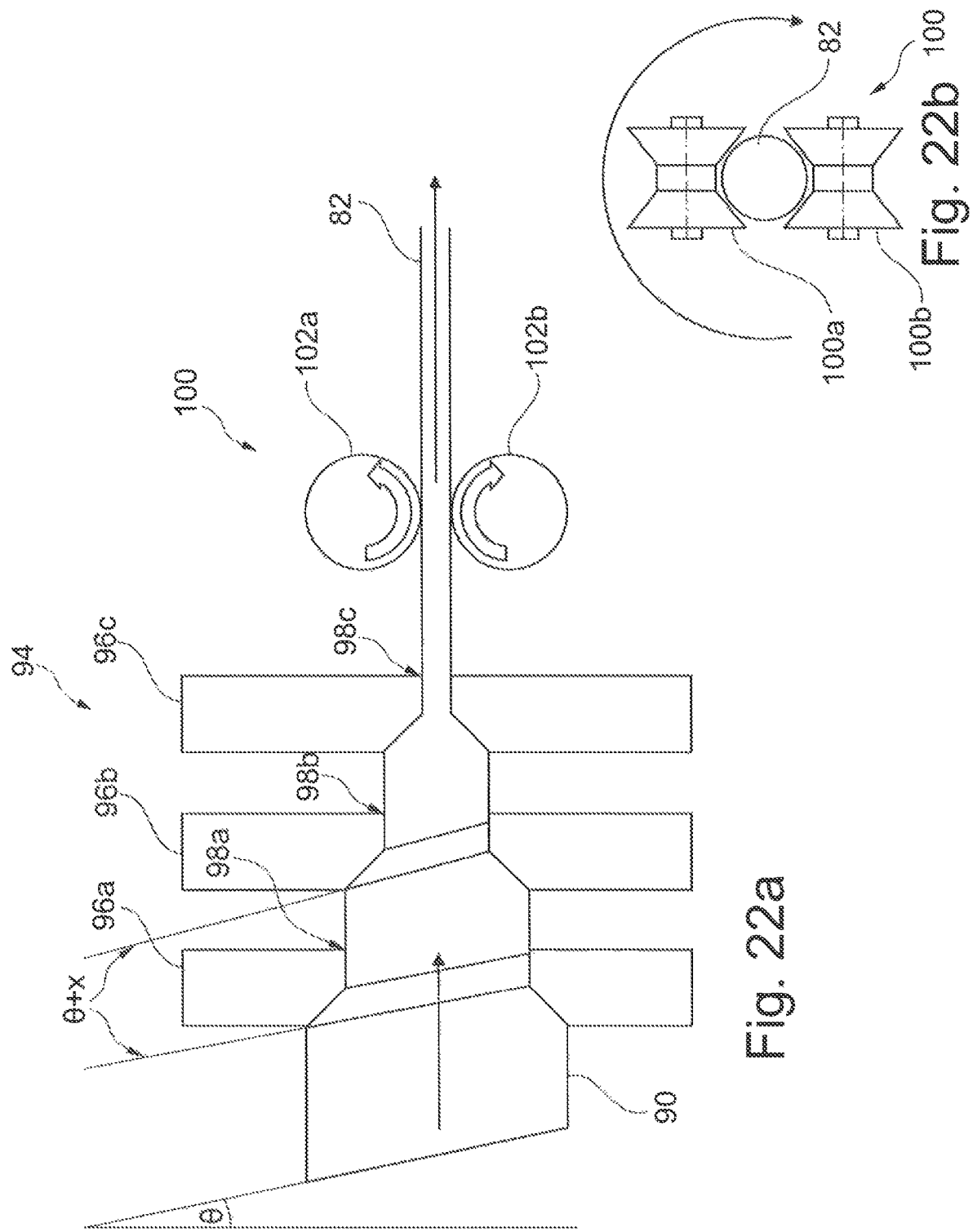

WIRE-DRAWING METHOD AND SYSTEM

TECHNICAL FIELD

The disclosure relates to a method and system for wire-drawing a wrapped sheet comprising a plurality of copper layers and a plurality of graphene layers, in particular to form a wire of enhanced electric conductivity with tailored dimensions.

BACKGROUND

Copper is known as a cost-effective and reliable electrically conductive material, second only to silver in its ability to conduct electricity. Increasing demand for electrical power and the need to generate and transmit electricity more efficiently, and more environmentally friendly, has spurred the search for conductors with an increased electric conductivity.

Intensive investigations have been made for improving the electrical performance of copper nanowires compared to copper thin films, such as described in T. Gao et al., Journal of Applied Physics 2013, 114, 063107. However, the effective conductivity of these nanowires is usually not significantly larger than its ideal bulk value, and may be highly dependent on technological constraints.

Co-pending U.S. application Ser. No. 15/290,865 describes techniques for increasing the electric conductivity in a composite structure comprising first and second graphene layers sandwiching a copper layer.

BRIEF SUMMARY OF THE DISCLOSURE

Known techniques for producing conductive elements may be enhanced by forming multilayer composite structures comprising wires with a plurality of copper layers and a plurality of graphene layers.

These objectives are achieved with a wire-drawing method according to independent claim 1 and a wire-drawing system according to independent claim 16. The dependent claims relate to preferred embodiments.

The disclosure relates to a wire-drawing method, comprising: providing a rod comprising a wrapped sheet, wherein the sheet comprises a plurality of copper layers and a plurality of graphene layers; extracting an inner layer of the wrapped sheet from the rod to form a spiral; and forming a wire by feeding the spiral through an opening of a die unit.

The wire-drawing technique allows to efficiently form a wire of a desired shape and diameter from a wrapped multilayer sheet, in particular by controlling a shape and/or diameter of the opening of the die unit.

Extracting an inner layer of the wrapped sheet may comprise pushing and/or pulling the wrapped sheet through the opening of the die unit.

In an example, the opening has an elliptic cross section, in particular a circular cross section.

The spiral may be fed through the opening in a feeding direction.

In an example, the opening has an inclination angle with respect to the feeding direction of the spiral.

Feeding the spiral through an opening having an inclination angle allows to twist the layers of the spiral with respect to one another, which may assist in tuning the mechanical and/or electrical properties of the resulting wire.

In an example, the inclination angle is no smaller than 5°, in particular no smaller than 10° or 15°.

In an example, the inclination angle is no larger than 30°, in particular no larger than 25° or 20°.

Forming the wire may comprise feeding the spiral through a first opening of the die unit, and subsequently feeding the spiral through a second opening of the die unit downstream of the first opening, wherein the second opening is smaller than the first opening.

A multi-stage drawing through openings with increasingly smaller dimensions may allow a careful tailoring of a size and diameter of the resulting wire.

In an example, a diameter and/or a surface area of the second opening is smaller than the diameter and/or surface area of the first opening.

In an example, the first opening and/or the second opening has an elliptic cross section, in particular a circular cross section.

The first opening may have a first inclination angle with respect to a feeding direction of the spiral, and/or the second opening may have a second inclination angle with respect to a feeding direction of the spiral.

In an example, the first inclination angle and/or the second inclination angle is no smaller than 5°, in particular no smaller than 10° or 15°.

In an example, the first inclination angle and/or the second inclination angle is no larger than 30°, in particular no larger than 25° or 20°.

In some examples, the second inclination angle is equal to the first inclination angle.

In other examples, the second inclination angle differs from the first inclination angle.

Varying the inclination angle allows to fine-tune the twist angle, and hence the mechanical and/or electrical properties of the resulting wire.

The spiral may be fed through one or more additional openings to further fine-tune the mechanical and/or electrical properties of the wire.

In particular, forming the wire may comprise feeding the spiral through a third opening of the die unit downstream of the second opening, wherein the third opening is smaller than the second opening.

In particular, a diameter and/or a surface area of the third opening may be smaller than a diameter and/or a surface area of the second opening.

The third opening may have an elliptic cross section, in particular a circular cross section.

The third opening may have a third inclination angle with respect to a feeding direction of the spiral.

The third inclination angle may be no smaller than 5°, in particular no smaller than 10° or 150° The third inclination angle may be no larger than 30°, in particular no larger than 25° or 20°.

In some examples, the third inclination angle is equal to the second inclination angle and/or the first inclination angle.

In other examples, the third inclination angle differs from the second inclination angle and/or the first inclination angle.

In an example, the feeding the spiral comprises pushing and/or pulling the spiral through the opening.

Pushing and/or pulling the spiral through the opening may simultaneously provide the necessary pulling and fusing forces to form a multilayer composite wire structure.

In an example, the feeding the spiral comprises pulling the spiral through the opening by means of a plurality of pulling rolls, in particular a plurality of rotating pulling rolls.

In an example, the pulling rolls may in addition orbit around the spiral, in particular around a longitudinal axis of the spiral.

Orbiting the pulling rolls around the spiral with a preselectable spacing between them may allow to provide a wire with a desired and carefully controlled outer diameter and optimum round shape.

A copper layer, in the sense of the present disclosure, maybe understood to denote a layer comprising copper. In some examples, the copper layer is a pure copper layer, in particular a copper layer comprising at least 90% copper by weight. In other examples, the copper layer may comprise copper and other components and materials in addition to the copper.

In an example, at least part of at least one copper layer of the plurality of the copper layers has a Cu (111) crystallographic orientation, which, as used herein, refers to the lattice plane of Copper having 1, 1, and 1, as its Miller Indices.

The sheet according to the disclosure may comprise any number of copper layers.

According to an example, at least one copper layer of the plurality of copper layers may have a thickness of no more than 500 µm, and in particular no more than 100 µm or no more than 50 µm.

In an example, at least one copper layer of the plurality of copper layers has a thickness of no larger than 25 µm or no larger than 10 µm, and in particular no larger than 5 µm.

Thin copper layers reduce the volume percentage of copper in favor of graphene in the resulting multi-composite wire structure, which may enhance the electric conductivity, thermal conductivity and/or mechanical strength of the resulting wires.

In addition, reducing the thickness of the copper layers may reduce the amount of inelastic scattering of electrons within the copper, which may further enhance the electric conductivity.

In an example, at least one copper layer of the plurality of copper layers has a thickness of no larger than 2 µm, and in particular no larger than 1 µm.

In an example, at least one copper layer of the plurality of copper layers has a grain size of at least 1 µm, and in particular at least 5 µm.

Enhancing the grain size of the copper layer may further reduce inelastic scattering of electrons within the copper layer, which enhances the electric conductivity.

In an example, at least one copper layer of the plurality of copper layers has a grain size of at least 10 µm, and in particular at least 50 µm.

Grain size, in the sense of the present disclosure, may refer to an average distance between grain boundaries.

In an example, the sheet comprises a first copper layer on a first surface side of the sheet, and a second copper layer on a second surface side of the sheet opposite from the first surface side.

In this configuration, the windings of the spiral comprise copper on an outer surface layer, which prevents the windings from fusing together homogeneously and provides optimum conditions for connecting the resulting wire to sockets, plugs, etc., such as by means of soldering, clamping, crimping, etc.

Graphene layers may be provided in the interior of the sheet to enable easy sliding of the copper layers, which may assist in extracting the inner layer of the wrapped sheet and forming the spiral.

In an example, the sheet comprises a copper layer and first and second graphene layers sandwiching the copper layer.

In general, the sheet may comprise any number of graphene layers.

At least part of the graphene layers may alternate with at least part of the copper layers in the sheet.

The resulting multilayer composite structure of copper and graphene may demonstrate enhanced electrical conductivity, thermal conductivity and mechanical strength.

Graphene, in the sense of the present disclosure, may refer to a carbon-comprising layer in which the carbon atoms are, as in graphite, hexagonally arranged and generally $sp^2$ hybridized. The resulting structure may be a honeycomb-shaped hexagonal pattern or fused six-member carbon rings.

The term graphene may refer to a configuration with a carbon monolayer, but in practice a small number of layers may also be denoted as graphene.

In some examples, the graphene comprises only carbon. In other examples, the graphene may be doped to comprise atoms and/or molecules different from carbon atoms.

In an example, at least one graphene layer of the plurality of graphene layers has a thickness of no larger than 5 nm, and in particular no larger than 2 nm.

In an example, at least one graphene layer of the plurality of graphene layers may comprise at most 20 graphene monolayers, and in particular at most 10 graphene monolayers.

In particular, at least one graphene layer of the plurality of graphene layers may be a monolayer or a bi-layer.

In an example, at least one graphene layer of the plurality of graphene layers comprises metal atoms, in particular metal atoms ring-centered on graphene rings.

A functionalization of graphene with ring-centered delocalized metal atoms may create anchoring points for firmly connecting the graphene layers to the copper matrix without changing the hexagonal lattice properties of the graphene structure.

In an example, the metal atoms comprise silver atoms.

The disclosure further relates to a wire-drawing system, comprising: a die unit comprising an opening; an extracting unit to extract an inner layer of a wrapped sheet to form a spiral, wherein the sheet comprises a plurality of copper layers and a plurality of graphene layers; and a feeding unit to feed the spiral through the opening of the die unit.

In some examples, the die unit and/or the extracting unit and/or the feeding unit may be separate units.

In other examples, some or all of the die unit and/or extracting unit and/or feeding unit may be combined into a common unit.

In particular, the extracting unit may comprise the feeding unit. A combined extracting-feeding unit may comprise a pushing unit to push the wrapped sheet towards and against the die unit and through the opening of the die unit, thereby extracting an inner layer of small diameter and forming a spiral.

The opening may have a diameter smaller than a diameter of the wrapped sheet or spiral, but larger than a diameter of the wrapped inner layer. In particular, this may allow extracting the inner layer of the wrapped sheet by pushing the wrapped sheet against the boundary of the opening, and thereby extracting the inner layer through the opening.

A pulling unit pulling the inner layer from the opposite side of the opening may assist in the extracting of the inner layer and the feeding of the spiral through the opening.

The opening may have an elliptic cross section, in particular a circular cross section.

The opening may have an inclination angle with respect to a feeding direction of the spiral.

In an example, the die unit comprises a first opening and a second opening downstream of the first opening in a feeding direction, wherein the second opening is smaller than the first opening.

The die unit may additionally comprise a third opening downstream of the second opening in the feeding direction, wherein the third opening is smaller than the second opening.

The first opening may have a first inclination angle with respect to a feeding direction of the spiral.

The second opening may have a second inclination angle with respect to a feeding direction of the spiral.

The third opening may have a third inclination angle with respect to a feeding direction of the spiral.

The first, second, and third inclination angles may be identical, or may differ from one another.

In an example, the first inclination angle and/or the second inclination angle and/or the third inclination angle is no smaller than 5°, in particular no smaller than 10° or 15°.

In an example, the first inclination angle and/or the second inclination angle and/or the third inclination angle is no larger than 30°, in particular no larger than 25° or 20°.

In an example, the feeding unit comprises a pushing unit to push the spiral through the opening.

The feeding unit may alternatively or additionally comprise a pulling unit to pull the spiral through the opening.

In an example, the pulling unit comprises a plurality of pulling rolls, in particular a plurality of rotating pulling rolls.

In an example, the pulling rolls are configured to orbit around the spiral, in particular around a longitudinal axis of the spiral.

The features of the wire-drawing method and wire-drawing system have been described above in isolation. However, in some examples some or all of the features as described above may be combined.

Wire-drawing method and systems according to the disclosure will now be described with reference to composite structures comprising copper layers sandwiched by graphene layers, and multilayer structures formed by stacking such composite structures.

However, this is merely an example, and the disclosure relates to drawing a wire from any wrapped sheet comprising a plurality of copper layers and a plurality of graphene layers.

BRIEF DESCRIPTION OF THE FIGURES

The effects and numerous advantages of the present disclosure will become clearer from a detailed description of examples with reference to the accompanying drawings, in which:

FIGS. 11a and 11b illustrate a hexa-hepta functionalization of graphene layers with metal atoms according to an example;

FIG. 20 is a schematic illustration of a wire-drawing system according to an example;

FIG. 21 is a perspective schematic illustration of a composite wrap extracted to form a band spiral according to an example;

FIGS. 22a and 22b illustrate the functioning of a wire-drawing system according to an example;

DETAILED DESCRIPTION

Figure 1:
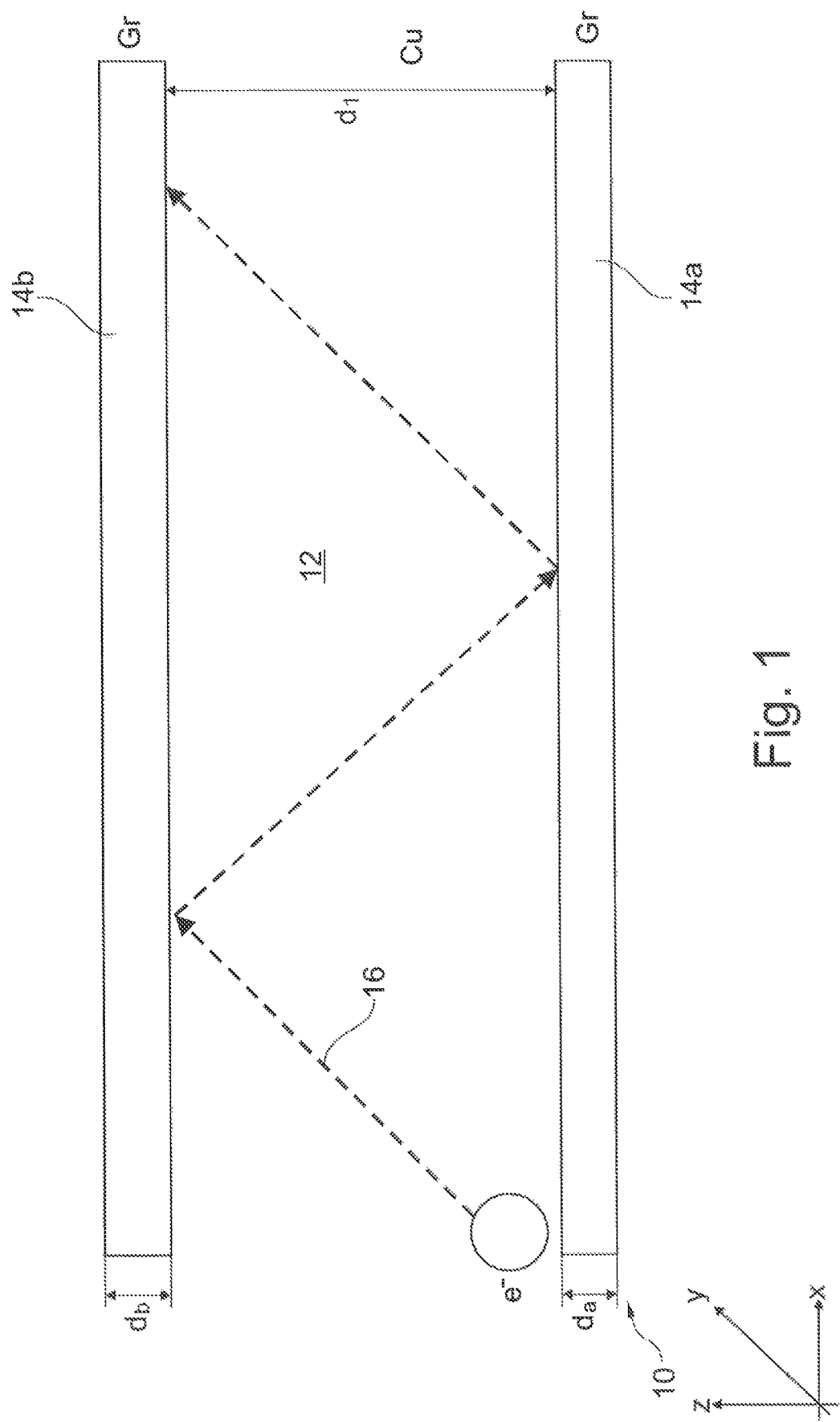
FIG. 1 is a schematic cross-section of a composite structure according to an example.

FIG. 1 is a schematic illustration of the composite structure 10 according to an example in a cross-sectional view. The composite structure 10 comprises a copper layer 12 sandwiched by a first (lower) graphene layer 14a and a second (upper) graphene layer 14b.

The copper layer 12 may be formed of pure copper (Cu), in particular in a Cu (111) crystallographic orientation. However, in other examples, the copper layer comprises additional material other than copper, such as doped atoms or nanoparticles, as will be described in more detail below.

The copper layer 12 as shown in FIG. 1 extends at a width or thickness $d_1$ between the first graphene layer 14a and the second graphene layer 14b, wherein $d_1$ is generally no larger than 25 μm. For instance, the copper layer 12 may be formed at a thickness of 20 μm or 10 μm. In other examples, the copper layer 12 may be formed at a thickness of no larger than 2 μm or no larger than 1 μm.

The first graphene layer 14a and second graphene layer 14b are generally much thinner than the copper layer 12, and may in particular be graphene layers comprising a single graphene monolayer, or a plurality of graphene monolayers. In FIG. 1, the width or thickness of the graphene layers 14a and 14$b$ is denoted by $d_a$ and $d_b$, respectively. For instance, $d_a$ and $d_b$ may both amount to 5 nm, 2 nm, or even less.

In a graphene monolayer configuration, the conduction band touches the valence band in single points, the so-called Dirac points. The infinitesimal small band gap explains the superior electric conductivity of graphene monolayer structures as opposed to graphite.

The first graphene layer 14$a$ and the second graphene layer 14$b$ may be chemically connected or bound to the copper layer 12, such as deposited on the copper layer 12 by means of chemical vapor deposition, as will be described in additional detail below.

The schematic illustration of FIG. 1, the width directions $d_1$, $d_a$, and $d_b$ define the z direction. The copper layer 12 and first and second graphene layers 14$a$, 14$b$ may spatially extend widely in the planar spatial directions x, y perpendicular to the width direction z, so that the composite structure 10 forms a thin foil, as will be described in additional detail below.

Graphene coatings on copper are known to have remarkable in-plane stiffness to prevent mechanical deformation, such as surface distortions. Moreover, graphene coatings show impermeability to protect copper against reactive chemical or gaseous species, along with low density-of-states to avoid perturbation of the copper surface potential after coating. All of these superior physical properties make graphene an ideal non-interacting barrier for copper samples, prevent oxidation and surface contamination in general, and contribute to a composite structure with superior parameters.

FIG. 1 further illustrates schematically the path 16 of an electron e traveling through the copper layer 12. As can be taken from FIG. 1, the electron e is repeatedly scattered off the boundaries between the copper layer 12 and first graphene layer 14$a$ and second graphene layer 14$b$, respectively. The graphene layers 14$a$, 14$b$ protect the surface of the copper layer 12 to result in a largely smooth, pristine and wrinkle-free layer. In particular, graphene grown on Cu (111) surfaces is only weakly interacting with the Cu surface states. The relatively weak coupling between the carbon 2$p$ orbitals of graphene and the Cu 4$p$ orbitals leads to predominantly elastic surface scattering, which reduces the electric conductivity of the composite structure 10 in the planer direction x, y.

The graphene layers 14$a$, 14$b$ in addition improve the thermal conductivity of the composite structure 10. In general, thermal device design is becoming an important part of electric and microprocessor engineering. The high thermal conductivity of the graphene layers 14$a$, 14$b$ can provide a parallel phonon component for heat conduction.

In addition, the graphene layers 14$a$, 14$b$ enhance the mechanical strength of the composite structure 10 in the planer direction x, y.

Figure 2:
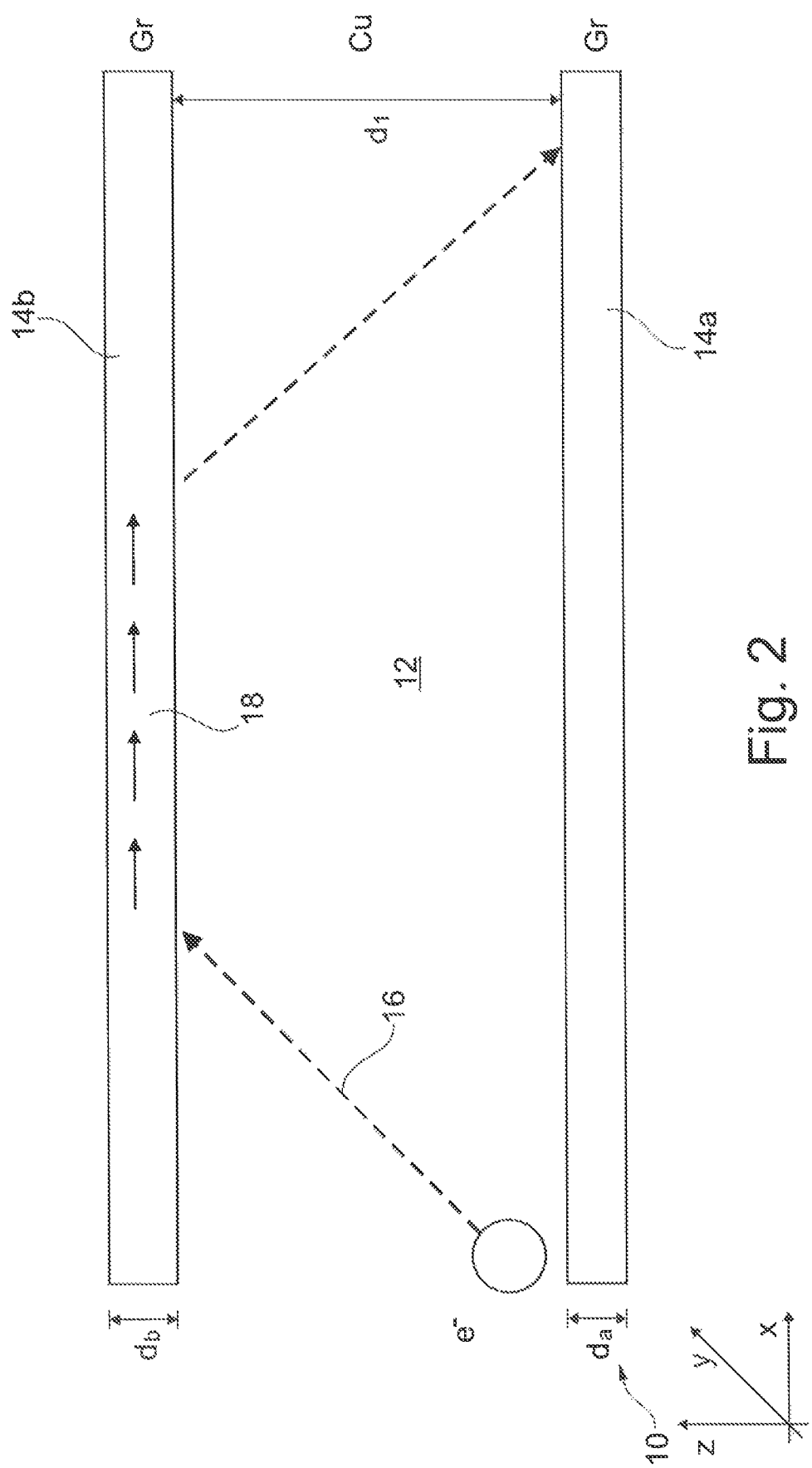
FIG. 2 is a schematic cross-section illustrating electron tunneling in a composite structure according to an example.

FIG. 2 is a schematic cross-sectional drawing of the composite structure 10 that generally corresponds to FIG. 1, but illustrates a tunneling mechanism in which electrons tunnel through part of the graphene layers 14$a$, 14$b$ to result in even higher electric conductivity. A composite structure 10 with a thin copper layer 12, in particular a copper layer 12 whose width $d_1$ is in the range of only a few electron mean free path lengths in copper, presents a waveguide-like structure where electrons experience only a fraction of the bulk electrical resistance. This effect exploits the wave nature of the electrons in a quantum electrodynamic description. In particular, electrons traveling through the copper layer 12 may tunnel through electron tunnels 18 that form in the graphene layers 14$a$, 14$b$. Since the electrons travel through an ideal graphene monolayer 14$a$, 14$b$ close to the speed of light while their speed in the copper layer 12 is much lower in general, and also limited due to various scattering effects, the electron wave approaching the copper/graphene interface appears to be back-scattered not at the location of the impact but further down in the flow direction (to the right in FIG. 2). As shown in the electron path 16 in FIG. 2, the electron is still back-scattered from the graphene layer 14$b$ into the copper layer 12, but with a displacement corresponding to the distance it traveled (tunneled) through the graphene layer 14$b$. Because of the large difference in electron speed between copper and graphene in a quantum approach, an electron e travels a certain distance within the composite structure 10 much faster than in a classical particle approach. Given that a higher electron speed is generally equivalent to a better electrical conductivity, the possibility of electron tunneling in a composite structure 10 with a thin copper layer 12 sandwiched by graphene layers 14$a$, 14$b$ leads to an enhanced electric conductivity.

The effect may be explained in additional detail in terms of the Klein effect: A peculiar property of the Dirac Hamiltonian is that charge carriers (like electrons) cannot be confined by electrostatic potentials. In conventional conductors, if an electron strikes an electrostatic barrier that has a potential height above the electron's kinetic energy, the electron wave function becomes evanescent within the barrier, and exponentially decays with increasing distance into the barrier. This means that the taller and wider the barrier is, the more the electron wave function will decay before reaching the other side. Thus, usually, the taller and wider the barrier is, the lower the probability of the electron quantum tunneling through the barrier.

However, if the particles are governed by the Dirac equation, their transmission probability actually increases with increasing barrier height. A Dirac electron that hits a tall barrier may turn into a hole and propagate through the barrier until it reaches the other side, where it may turn back into an electron. This phenomenon is sometimes called Klein tunneling.

One possible explanation for this phenomenon is that increasing barrier height may lead to an increased degree of mode matching between the wave functions of the holes within the barrier and the electrons outside of it. When the modes are perfectly matched (which may correspond to the case of an infinitely tall barrier), there may be perfect transmission through the barrier.

Applying these considerations to the composite structure 10 as shown in FIG. 2, the graphene layers 14$a$, 14$b$ may be thin enough to appear electrically invisible, allowing an electron to "see" through the graphene the copper layer on the other side of the tunnel. As soon as the electron is inside the electron tunnel 18, it experiences the much higher conductivity and speeds up in the direction of the main current flow.

Figure 3:
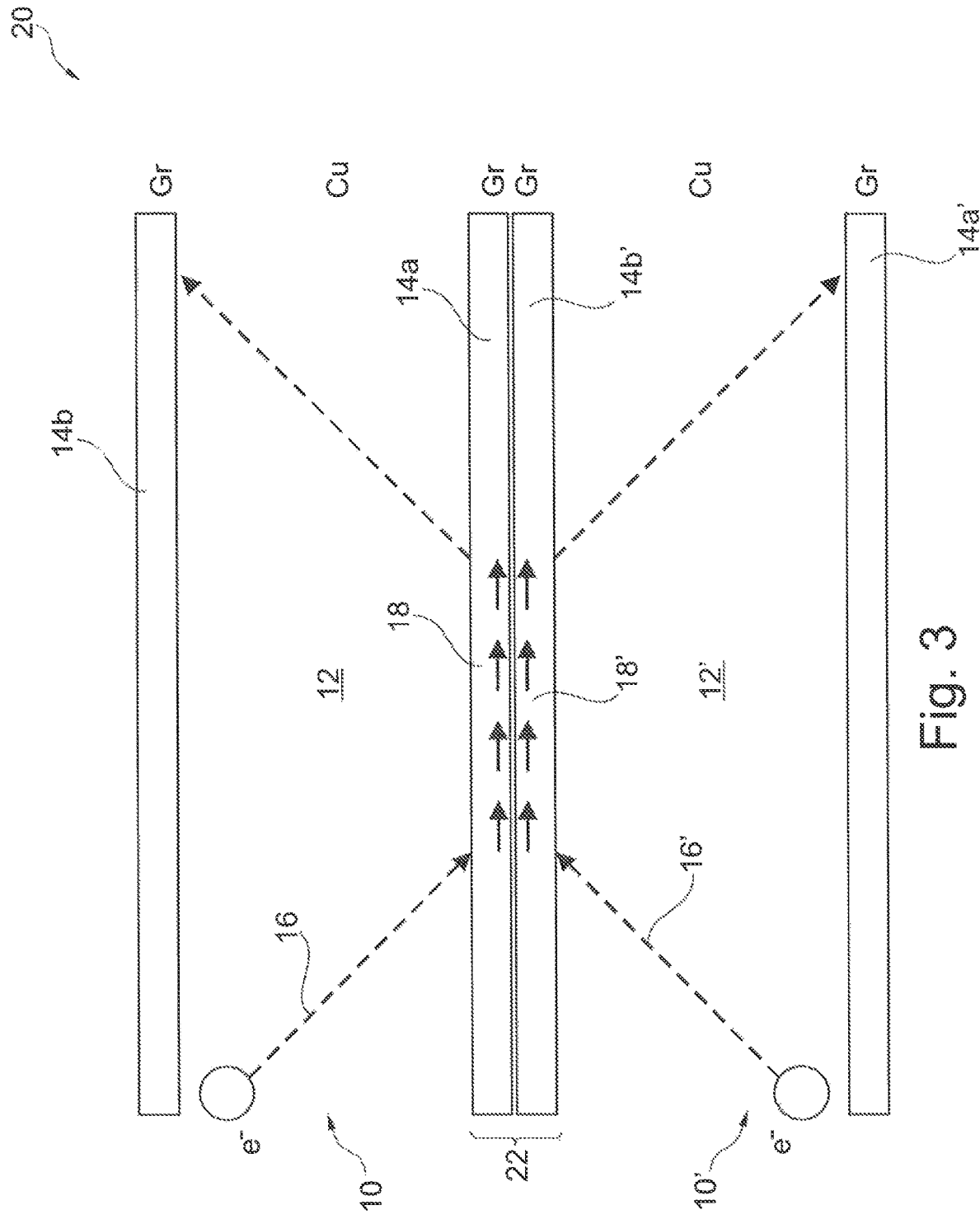
FIG. 3 is a cross-sectional schematic illustration of a composite bi-layer structure according to an example.

As illustrated in the conceptual cross-sectional diagram of FIG. 3, several composite structures 10 as described above with reference to FIGS. 1 and 2 may be stacked to form a multilayer composite structure 20. In the stacked multilayer composite structure 20, a first graphene layer 14$a$ of a first composite structure 10 is positioned on and in direct contact with the second graphene layer 14$b'$ of another composite structure 10'.

FIG. 3 shows a multilayer composite structure 20 with two elementary composite structures 10, 10', but in general a large number of composite structures may be stacked in the same way.

As can be taken from FIG. 3, the multilayer composite structure 20 comprises a graphene bi-layer 22 formed of a pair of graphene layers 14a, 14b' of neighboring composite structures 10, 10'.

The graphene bi-layer 22 takes particular advantage of the Klein effect as described above, since it allows electrons to tunnel back and forth between copper layers 12 of neighboring composite structures 10 through the electron tunnels 18, 18' formed in the graphene layers 14a, 14b'. Figuratively speaking, the adjacent graphene layers 14a, 14b' of the graphene bi-layer 22 form a high-speed tunnel path through the multilayer composite structure 20, which results in a superior electric conductivity.

The effect may be particularly pronounced in multilayer composite structures 20 with only exactly two adjacent graphene layers 14a, 14b'. With three or more layers, at least one graphene layer would not be directly connected to copper.

The composite structure 10 and multilayer composite structure 20 as described with reference to FIGS. 1 to 3 above may be employed to form electrical cables or wires with enhanced electrical conductivity.

Figure 4:
FIG. 4 is a flow diagram illustrating a method for forming a composite structure according to an example.

FIG. 4 is a schematic flow diagram illustrating a method for forming a composite structure.

In a first step S10, a copper foil having a first surface side and a second surface side opposite the first surface side is provided, wherein the copper foil has a thickness of no larger than 25 µm.

In a second step S12, a first graphene layer is deposited on the first surface side of the copper foil, and a second graphene layer is deposited on the second surface side of the copper foil.

Figure 5:
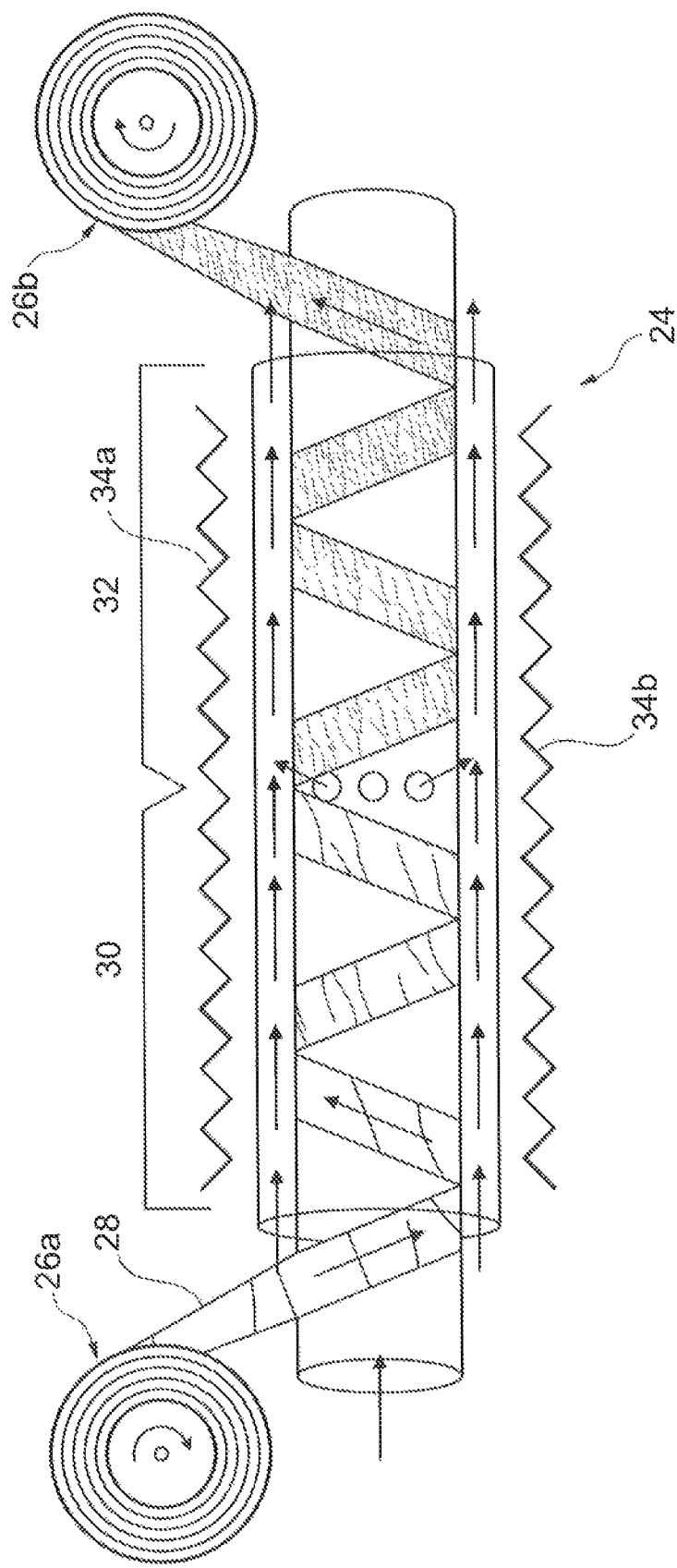
FIG. 5 is a schematic illustration of a system for forming a composite structure according to an example.

A plurality of coating techniques may be employed to deposit the first graphene layer and the second graphene layer on the copper foil. For instance, the depositing may comprise chemical vapor deposition techniques. A chemical vapor deposition (CVD) apparatus 24 is schematically illustrated in FIG. 5. A corresponding apparatus is described in greater detail by Polson, McNerney, Viswanath, et al. in Nature Scientific Reports, May 2015, 10.1038/srep 10257.

The CVD apparatus 24 as shown in FIG. 5 comprises a transport unit with a plurality of transport rolls 26a, 26b to transport a thin copper foil 28 subsequently through an annealing zone 30 and a growth zone 32 downstream of the annealing zone 30.

In the annealing zone 30, the copper foil 28 may be heated to temperatures in the range between 500° C. and 1000° C. in the presence of a pure argon gas flow (indicated by arrows in FIG. 5). By keeping the copper foil 28 for 20 to 30 minutes at elevated temperatures, the copper foil 28 is annealed, resulting in a considerable surface smoothening. Moreover, grain growth can be initiated.

Chemical vapor deposition takes place in the growth zone 32, where carbon atoms supplied by a precursor gas such as methane are deposited as the surface of the copper foil 28. The flow of the precursor gas is likewise illustrated by arrows in FIG. 5. Heating wires 34a, 34b are arranged along the length of the annealing zone 30 and growth zone 34 to provide the annealing temperature and break up the molecules of the precursor gas.

Graphene synthesis under atmospheric CVD conditions may be performed in the growth zone 32 at temperatures between 500° C. and 1000° C. using a gas mixture of argon and methane. Monolayer graphene growth up to 96% of the total area could be observed when a methane gas concentration varying between 0.2% and 1% by volume was employed. Higher methane concentrations may lead to the formation of multi-layer graphene structures.

It was also observed that the formation of the graphene monolayer on the copper foil 28 at elevated temperatures led to the preferred formation of a Cu (111) crystallographic orientation structure on the copper surface. In some instances, the graphene layer may act as a sort of template to the copper surface of the copper foil 28, which promotes the formation of a Cu (111) crystallographic orientation or copper structure because of the close lattice size match between copper and graphene in this configuration.

The CVD apparatus 24 as illustrated in FIG. 5 may be employed to deposit a graphene layer on a single surface side of the copper foil 28. In order to deposit graphene layers 14a, 14b on both sides of the copper foil 28 to arrive at a composite structure 10 as described with reference to FIGS. 1 and 2, one may pass the copper foil 28 through the CVD apparatus 24 twice, with opposite surface orientations of the copper foil 28.

Figure 6:
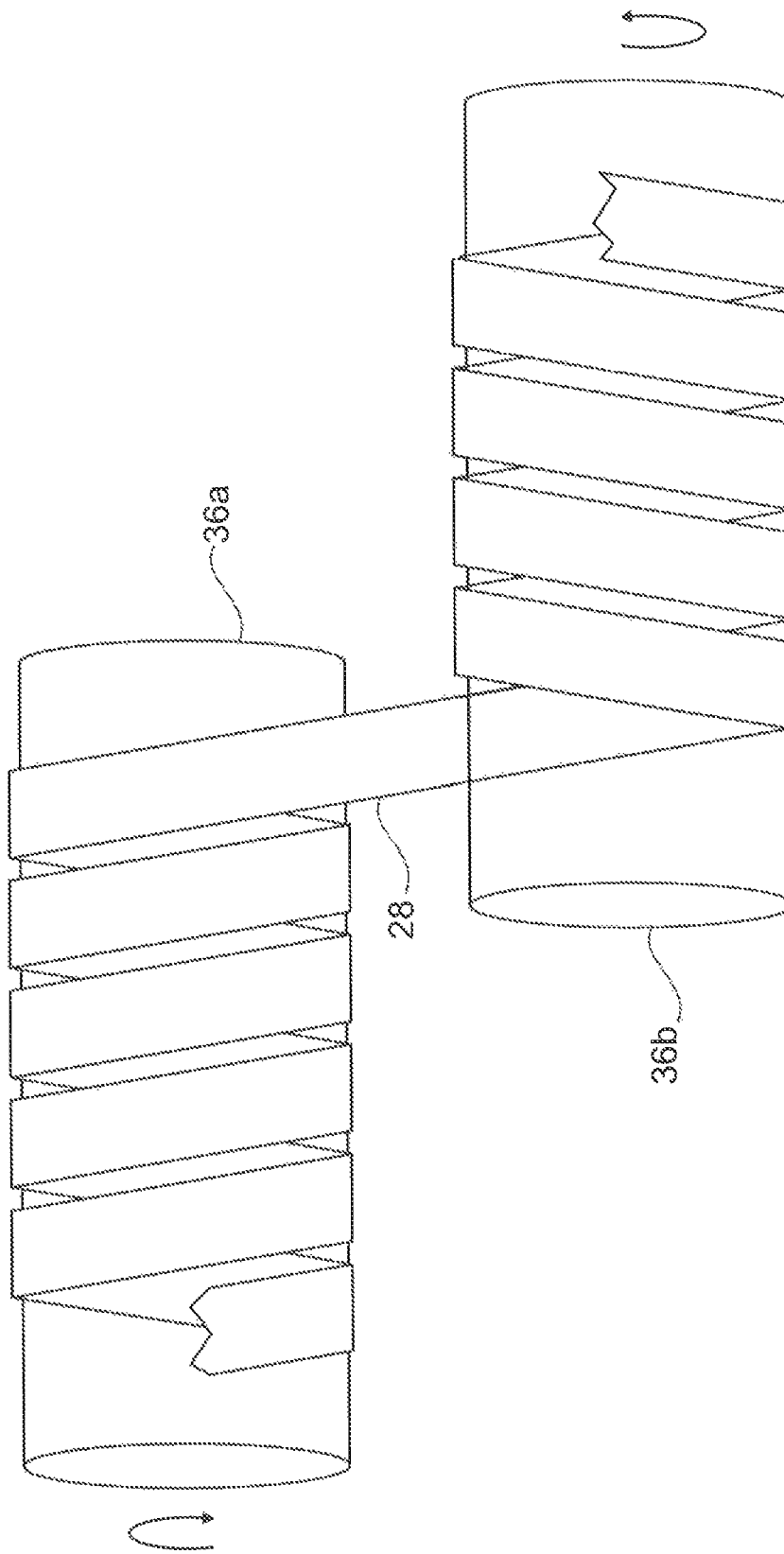
FIG. 6 is a schematic illustration of a transport unit with counter-rotating rollers according to an example.

The surface orientation may be changed by means of a transport unit comprising a pair of counter-rotating transport rolls 36a, 36b as shown in FIG. 6. For instance, a first transport roll 36a may rotate in a first (clockwise) direction and may pass the copper foil 28 to a second transport roll 36b rotating in an opposite (counter-clockwise) direction to change the orientation of the copper foil 28.

Optionally, the copper foil 28 may be etched before being fed into the CVD apparatus 24 to remove surface contaminants, such as by exposing the samples at 450° C. for 90 minutes to a hydrogen (70 vol.-%) and argon (30 vol.-%) gas flow.

Figure 7:
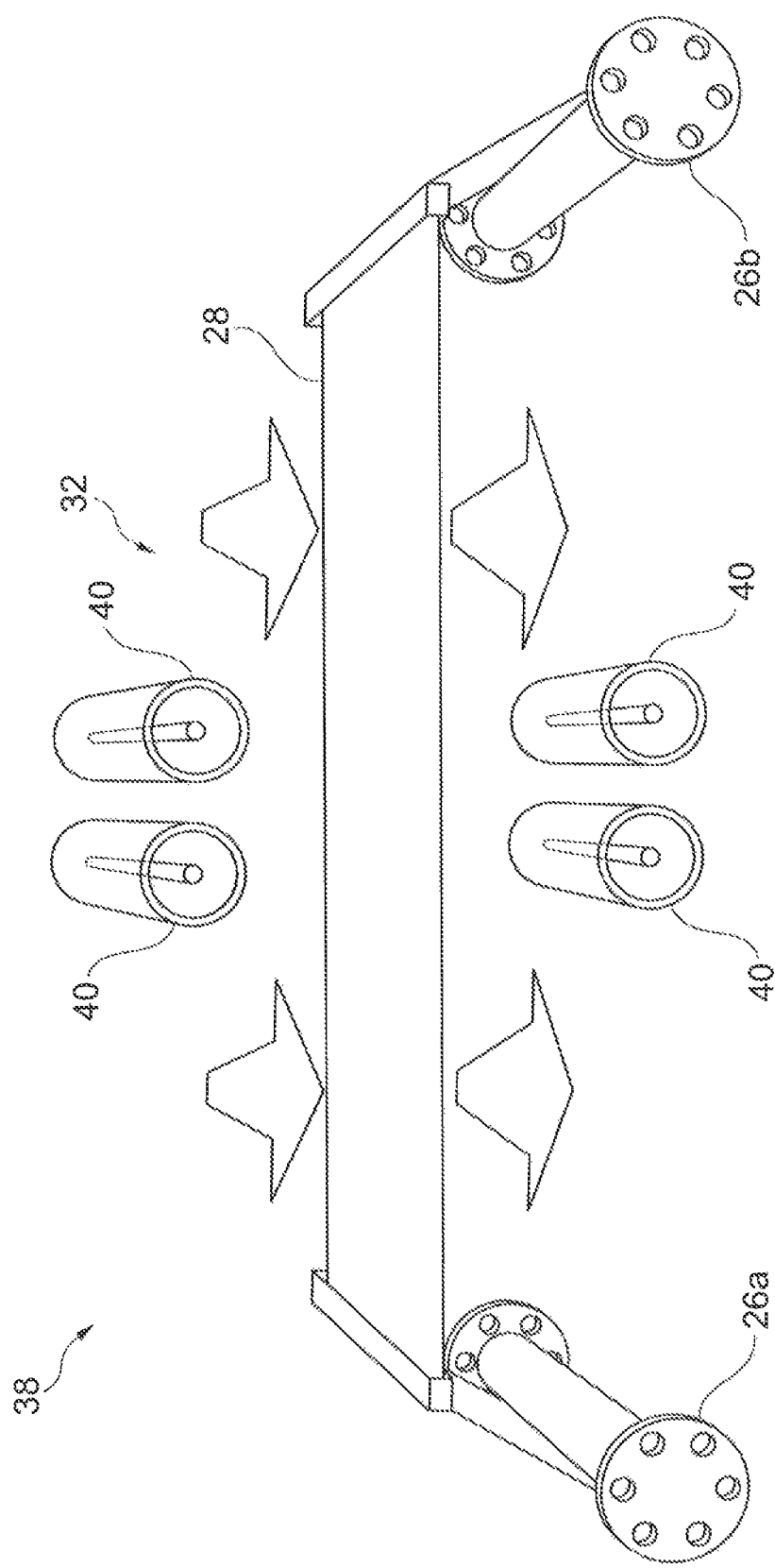
FIG. 7 is a schematic illustration of a system for forming a composite structure employing plasma tubes according to an example.

FIG. 7 is a schematic illustration of a chemical vapor deposition (CVD) apparatus according to another example that may be employed for forming the composite structures of the present disclosure. The CVD apparatus 38 illustrated in FIG. 7 is generally similar to the CVD apparatus 24 described above with reference to FIG. 5, but employs cold plasma-enhanced chemical vapor deposition rather than electrical heating by means of heating wires 34a, 34b.

In greater detail, the cold plasma CVD apparatus 38 comprises a transport unit with transport rolls 26a, 26b to transport a thin copper foil 28 through a growth zone 32. A supply unit (not shown in the schematic illustration of FIG. 7) directs a precursor gas comprising carbon into the growth zone 32 so that the precursor gas passes and circulates around the copper foil 28 on both of its opposing surface sides, as indicated by the arrows in FIG. 7. For instance, the precursor gas may comprise methane and/or butane and/or propane.

As can be further taken from FIG. 7, a plurality of plasma units 40 comprising plasma tubes are provided in the growth zone 32 on both sides of the copper foil 28 to generate a cold plasma discharge that breaks up the molecules of the precursor gas and allows the carbon atoms to coat both surface sides of the copper foil to form the first and second graphene layers 14a, 14b. As can be taken from FIG. 7 and the above description, the cold plasma CVD apparatus 38 allows for the graphene layers 14a, 14b to be deposited on both surface sides of the copper foil 28 simultaneously, thereby enhancing the process efficiency and reducing cycle times.

Preceding etching and/or annealing may take place in the same way as described above with reference to FIG. 5.

Figure 8:
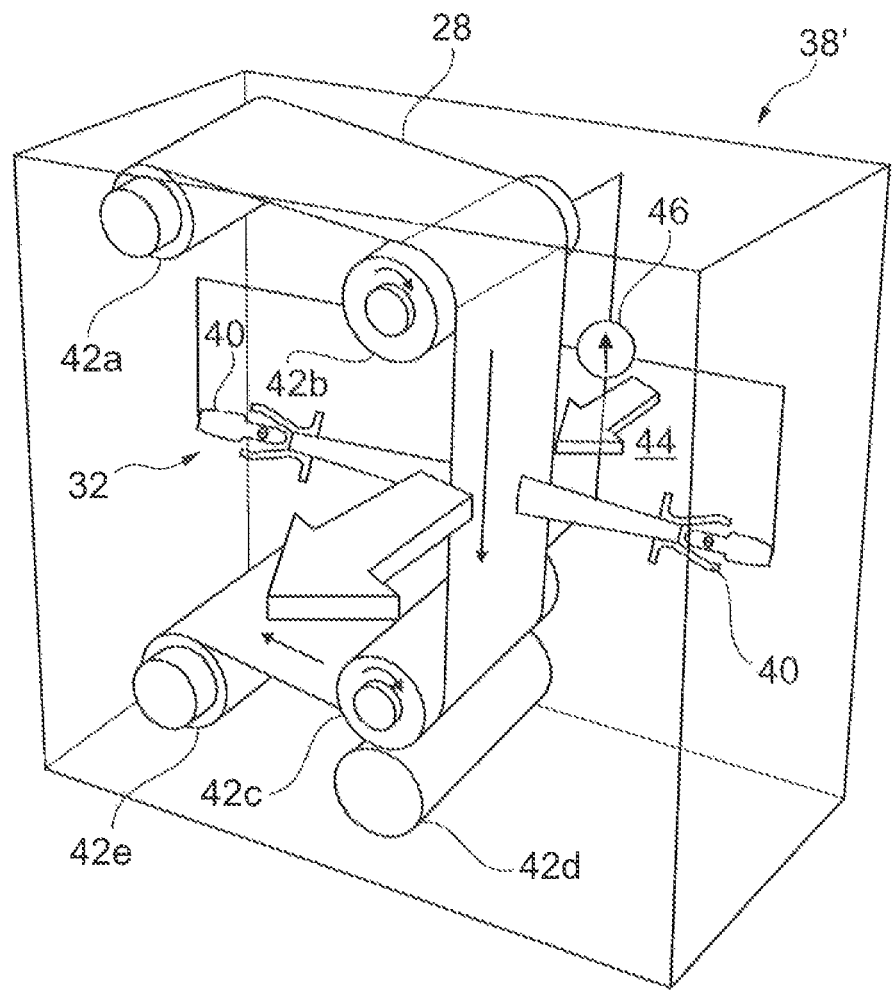
FIG. 8 is a schematic illustration of a system for forming a composite structure according to an example.

A cold plasma CVD apparatus 38' according to another example is schematically illustrated in the perspective view of FIG. 8.

As can be taken from FIG. 8, the cold plasma CVD apparatus 38' comprises a transport unit with a plurality of transport rolls 42*a* to 42*e* that transport a copper foil 28 through a growth zone 32, similarly to the configuration of FIG. 7. A supply unit 44 supplies a precursor gas such as methane and directs it through the growth zone 32 so that it passes and circulates around the copper foil 28 on both surface sides, as indicated by the arrows in FIG. 8. A deposition unit comprising a plurality of plasma units 40 with plasma tubes provides a cold plasma discharge to break up the molecules of the precursor gas so that the carbon is deposited on both surface sides of the copper foil as first and second graphene layers 14*a*, 14*b*.

However, unlike the configuration of FIG. 7 in which the copper foil 28 is transported horizontally through the growth zone 32, in the configuration of FIG. 8 the transport rolls 42*a* to 42*e* transport the copper foil 28 through the growth zone 32 in a vertical direction, i.e. in a direction that corresponds to the direction of the gravitational field in which the CVD apparatus 38' is placed. This allows to coat both surface sides of the copper foil 28 more uniformly.

Preceding etching and/or annealing may take place in the same way as described above with reference to FIG. 5.

As can be further taken from FIG. 8, the cold plasma CVD apparatus 38' additionally comprises a charging unit 46 electrically connected to the transport rolls 42*b*, 42C to electrically charge the copper foil 28. Moreover, the charging unit 46 is electrically coupled to the plasma units 40 to charge the precursor gas with a charge opposite from the charge of the copper foil 28. The electrostatic charging of the copper foil 28 facilitates the growth of the graphene layers 14*a*, 14*b* on the copper foil 28, and may lead to graphene layers 14*a*, 14*b* that are more homogeneous and uniform.

In contrast to more conventional graphene growth in a furnace that reaches temperatures between 900 and 1000® C., the cold plasma coating technology enables graphene deposition at a much lower temperature, which may be in the range of approximately 650° C. The reduced temperature leads to reduced thermal stress of the copper surface, and prevents damage and crystallographic reconfiguration of the surface of the copper foil that could be detrimental to an efficient graphene coating.

At the same time, the temperatures reached in the cold plasma coating technology are sufficiently high to provide for a controlled and thorough grain coarsening of the copper layer 12 of the composite structure 10. It may be advantageous to start with a copper layer 12 that already has a majority Cu (111) crystallographic orientation or grain orientation, which may subsequently transform into complete Cu (111) crystallographic orientation or coarse grain orientation after graphene deposition, supported by the good lattice match between the Cu atomic spacing and the graphene lattice constant.

Figure 9:
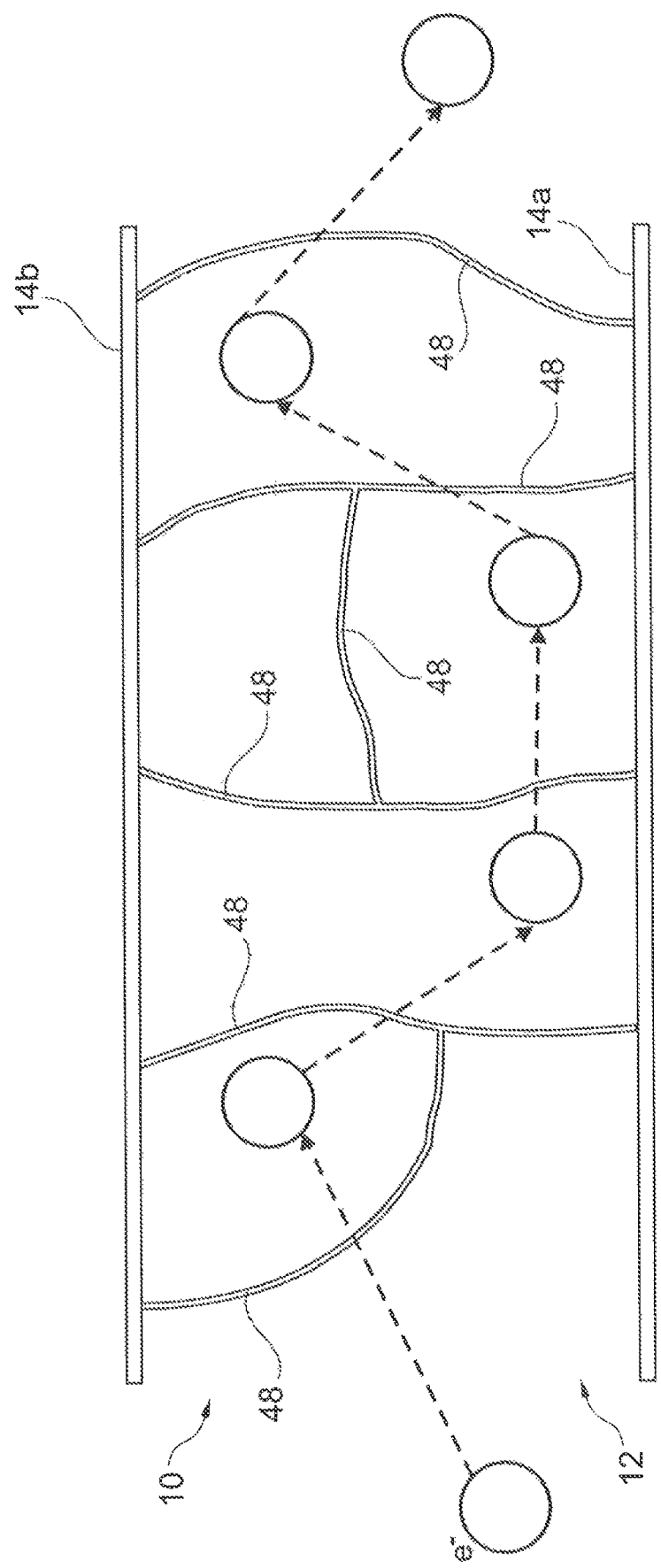
FIG. 9 is a schematic cross-sectional illustration to illustrate the effect of grain boundary scattering in a composite structure according to an example.
Figure 10:
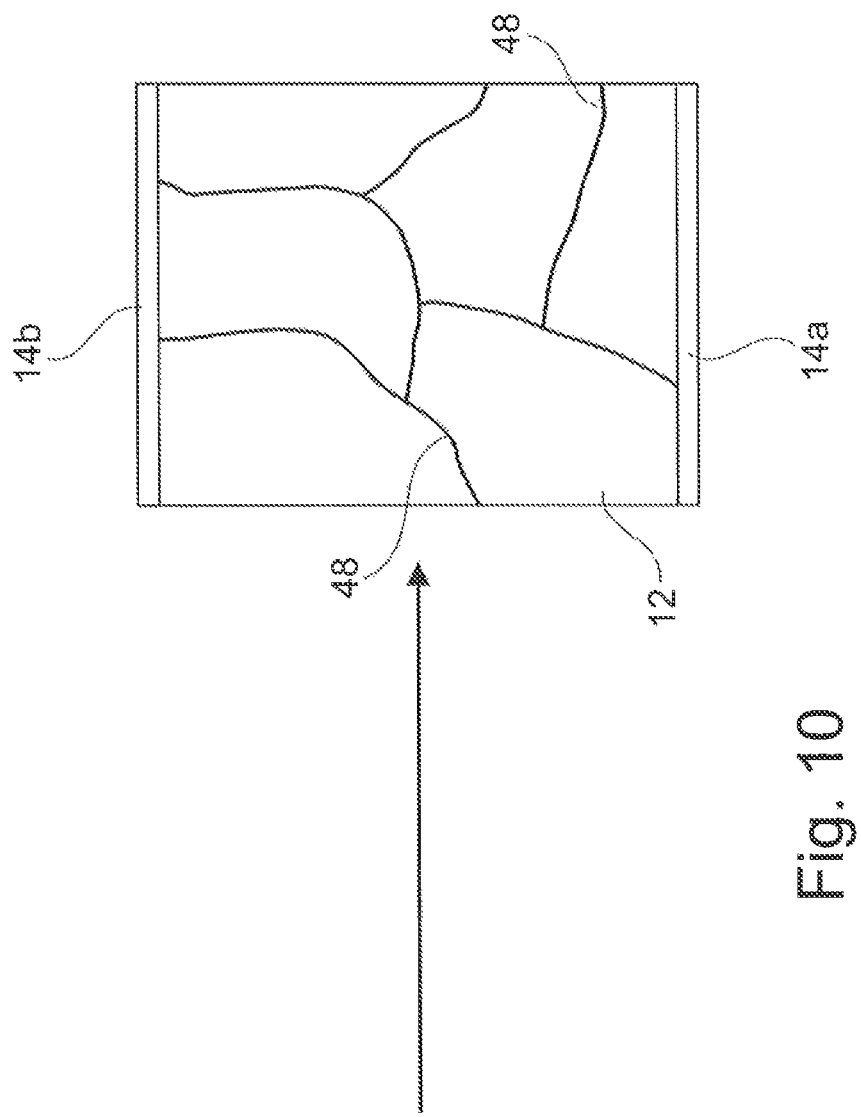
FIG. 10 is a schematic drawing illustrating the effect of coating and grain coarsening according to an example.

FIG. 9 is a schematic illustration of a composite structure 10 that generally correspond to the composite structure illustrated in FIGS. 1 and 2 above, but in addition depicts the grain boundaries 48 that may exist in the copper layer 12 and may lead to inelastic electron scattering that can hamper the electric conductivity of the composite structure 10. The thermal energy supplied in the course of the cold plasma coating process may lead to a grain coarsening, i.e. to a larger grain size of at least 10 μm or greater, as illustrated schematically in FIG. 10. The larger grain size may entail a reduction of inelastic scattering of electrons inside the copper layer 12, and may hence contribute to a higher electric conductivity.

The relatively low bonding strength between individual layers of the composite structure 10 or multilayer composite structure 20 may be enhanced by chemically functionalizing graphene, such as by hexa-hepta functionalization. In particular, plasmonic metal particles, such as silver nanoparticles, may be added to the graphene layers 14*a*, 14*b* without changing the hexagonal lattice properties. Instead of adding molecules to the individual carbon atoms of graphene (covalent functionalization), hexa-hepta functionalization or ring-centered functionalization adds metal atoms, such as silver nanoparticles to the center of the graphene ring. The bond is delocalized inside the graphene ring, which keeps the hexagonal arrangement undistorted, so that graphene retains its unique electrical properties. At the same time, the metal atoms may serve as anchoring points for thermally connecting the graphene layers 14*a*, 14*b* to the underlying copper layer 12.

FIGS. 11*a* and 11*b* are a plane view and a perspective view, respectively of a graphene monolayer 50 with the characteristic hexagonal carbon rings and show the doped ring-centered silver nanoparticles 52 delocalized inside the carbon rings.

The hexa-hepta functionalization can be performed after CVD growing a graphene monolayer on a pristine copper Cu (111) crystallographic orientation surface as described above. It may consist of a two-step process; a synthesis of $\eta^6$-graphene Cr(Co)$_3$ followed by silver nanoparticles attachment. Corresponding techniques have been described by S. Che et al. in "Retained Carrier-Mobility and Enhanced Plasmonic-Photovoltaics of Graphene via Ring-Centered Functionalization and Nano-Interfacing", Nano Letters, Jun. 6, 2017.

Forming Multilayer Composite Structures

The manufacturing techniques described above provide a composite structure 10 with a single copper layer 12 sandwiched by first and second graphene layers 14*a*, 14*b*, as illustrated in FIGS. 1 and 2. In order to provide the multilayer composite structures 20 as illustrated in FIG. 3 with their enhanced electrical conductivity, the coated copper foil 28 may be stacked.

In an example, the coated copper foil 28 may be cut into pieces or stripes, and several of these pieces may be stacked under pressure and heat.

In an example, pressing may involve sintering, such as hot sintering, microwave sintering or field-assisted sintering involving alternating current or direct current.

For instance, sintering temperatures may be in the range between 500° C. and 1000° C. By a suitable choice of the sintering temperature and sintering duration, the copper grain size may be further enhanced. Moreover, sintering allows the copper layers to better adapt to the graphene crystal structure, and hence fosters the formation of a crystallographic Cu (111) crystallographic orientation surface structure in the copper of the copper foil 28.

The stacking may be performed in a combined sintering and pressing apparatus under mechanical pressures in the range of 10 MPa to 300 MPa.

In an alternative configuration that will now be described in additional detail with reference to FIGS. 12 to 18, a multilayer composite structure 20 may be provided by wrapping and compacting the coated copper foil 28.

Figure 12:
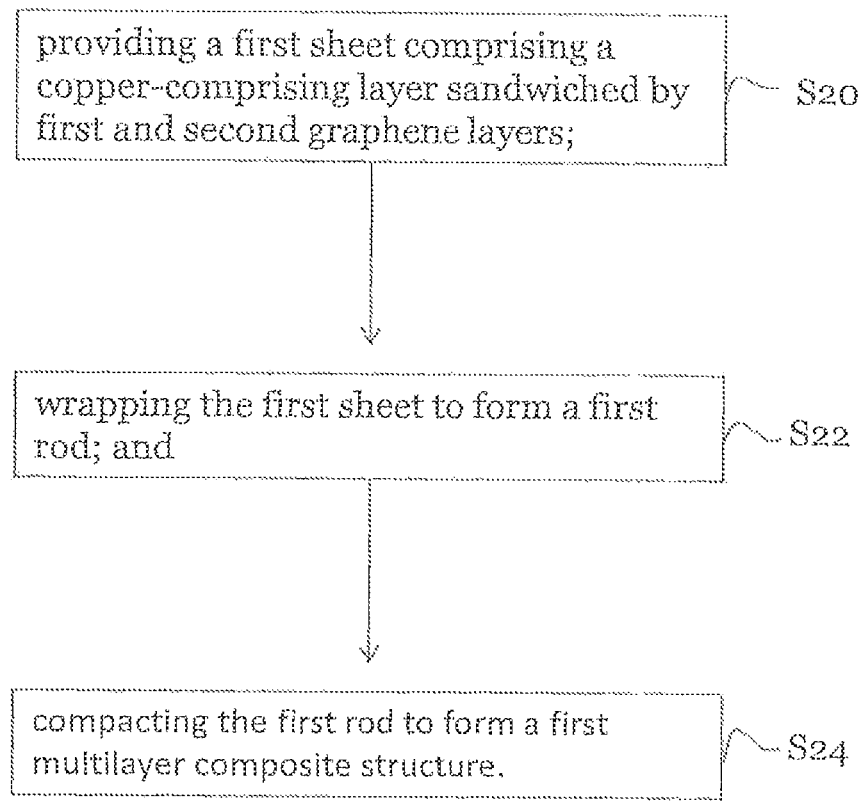
FIG. 12 is a flow diagram illustrating a method for forming a multilayer composite structure according to an example.

FIG. 12 is a flow diagram illustrating a method for forming a multilayer composite structure 20 comprising a stack of composite structures 10 according to an example.

In a first step S20, a first sheet comprising a copper-comprising layer sandwiched by first and second graphene layers is provided, such as the coated copper foil 28.

In a second step S22, the first sheet is wrapped to form a first rod.

In a third step S24, the first rod is compacted to form a first multilayer composite structure.

The sequence of steps as illustrated in FIG. 12 may be repeated several times. In particular, the multilayer composite structure resulting from step S24 may again be coated on both sides by back feeding the resulting multilayer foil into the cold plasma CVD apparatus 38, 38' as described above with reference to FIGS. 7 and 8, respectively, followed by a second round or several additional rounds of wrapping and compacting.

Figure 13:
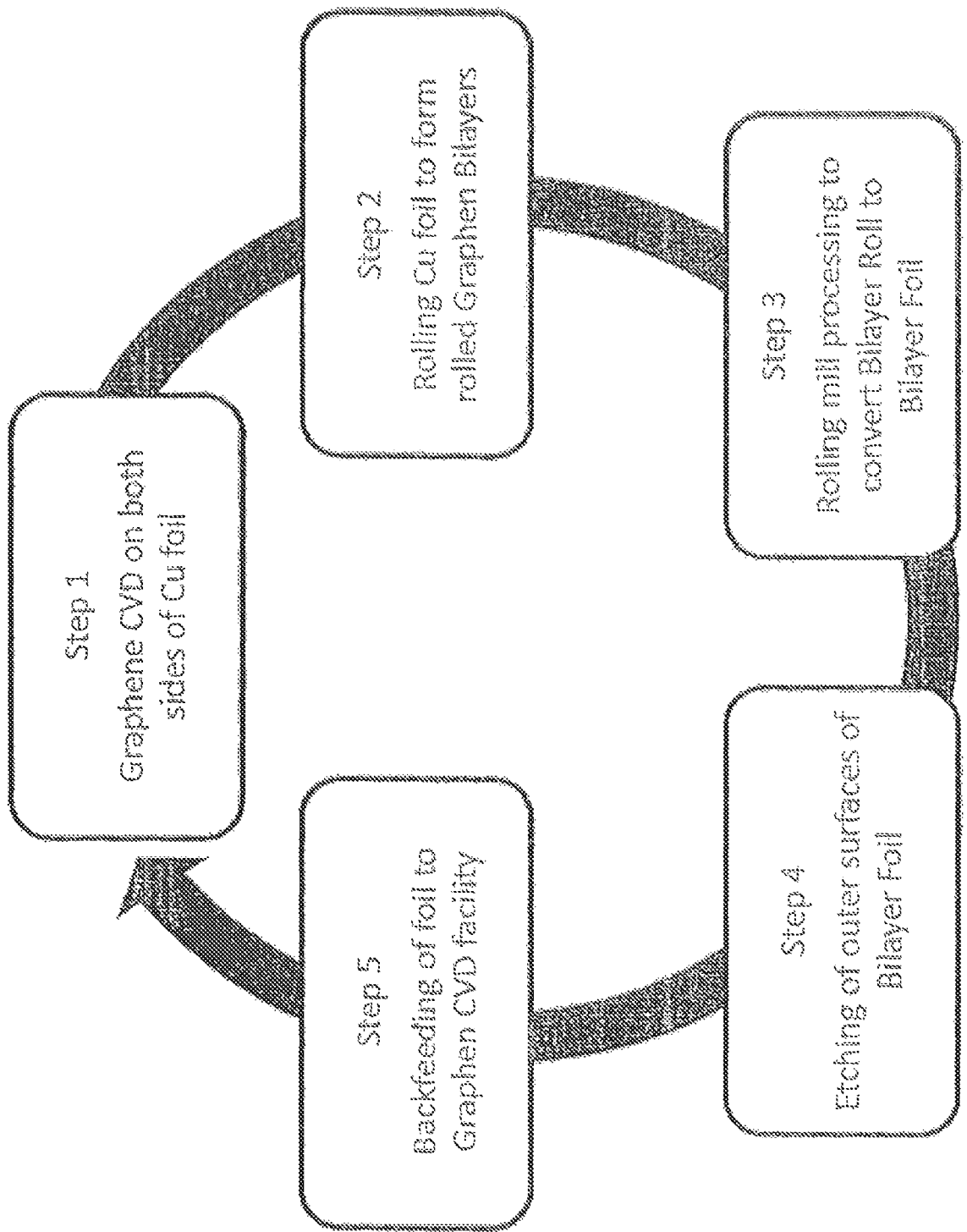
FIG. 13 is a cycle diagram illustrating a method for forming a multilayer composite structure according to an example.

An exemplary process cycle is illustrated in FIG. 13.

In step 1, graphene layers are deposited by means of chemical vapor deposition on both sides of a copper-comprising foil, such as by employing a cold plasma CVD apparatus 38, 38'.

In a subsequent step 2, the resulting foil is rolled or wrapped to form rolled graphene bi-layers.

In a subsequent step 3, the resulting rod is roll-milled to convert the bi-layer roll to a bi-layer foil.

In a subsequent (optional) step 4, the outer surfaces of the bi-layer foil may be etched to provide a pristine copper surface, before the foil is back fed into the graphene CVD facility in step 5.

The process cycle can be described by the following sequence of steps:
0. A counter is set to zero.
1. A graphene monolayer is grown on both sides of a copper-comprising foil in a CVD coating facility.
2. The coated foil is then wrapped around so that a tube or rod is created with a circular concentric structure of alternating copper and bi-layer graphene layers.
3. The rod is then compacted, such as by metal hot rolling pressing, creating a flat copper/graphene multilayer composite band containing a multitude or plurality of graphene bi-layers 22.
4. The resulting composite band is then etched on both surfaces to provide a pristine copper surface.
5. The counter is now increased by 1. If the counter is smaller than a pre-defined threshold, the process proceeds with step 1 by back-feeding the resulting structure into the CVD coating facility.
6. If the counter reaches the threshold value, the copper/graphene composite band is extracted from the coating and rolling cycle.

The process circle as described above may be called "CWH-Circle" (coating, wrapping, hot-rolling). The process circle may result in a multilayer composite structure in which the volume fraction of graphene is significantly enhanced compared to the single-layer composite structure 10 of FIG. 1. In particular, the process circle allows to vary the volume fraction of graphene in the matrix by selecting the number of circle iterations. This may allow to increase and/or tailor the electrical conductivity, the thermal conductivity, and/or the mechanical strength of the copper/graphene composite material to a desired value.

Figure 14:
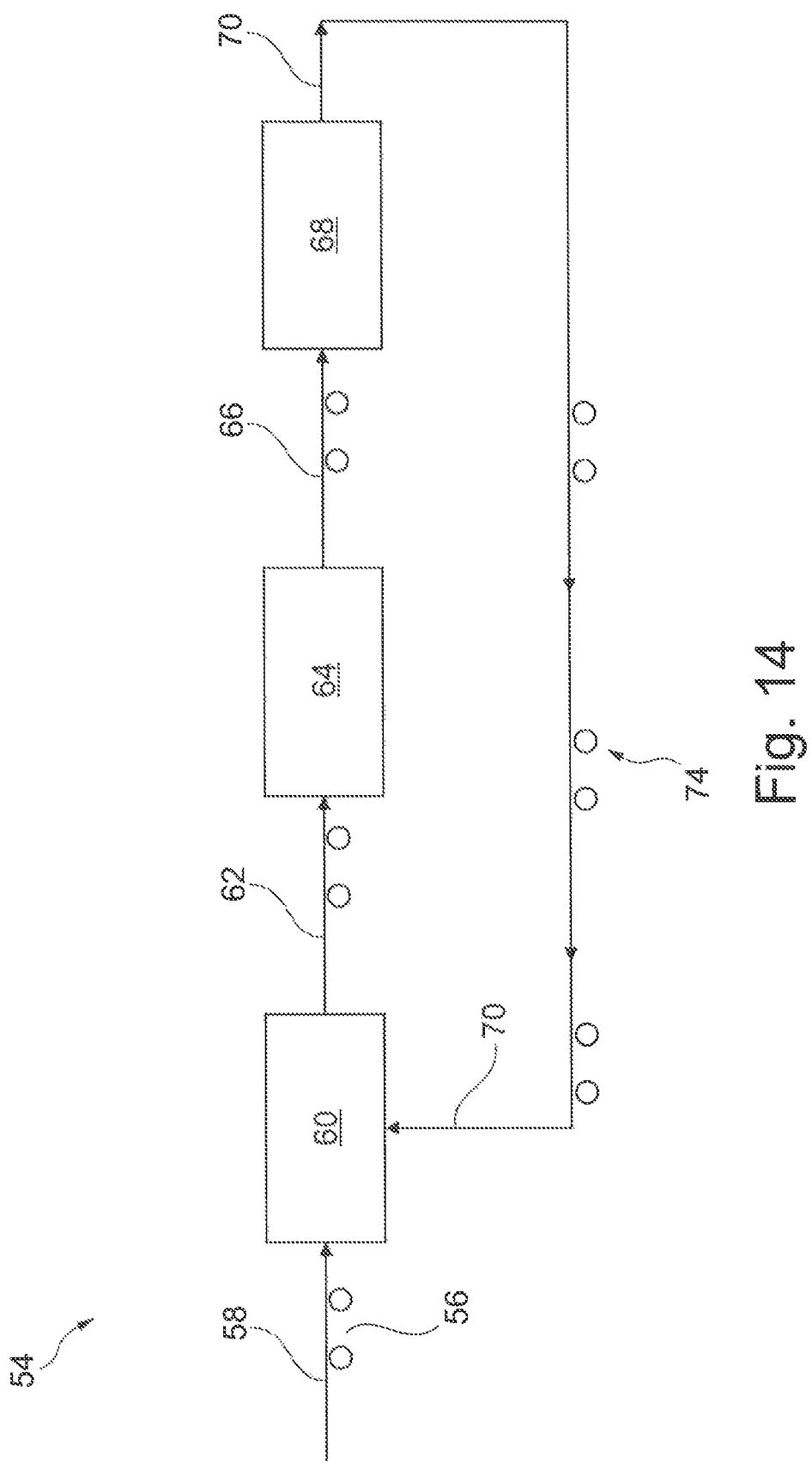
FIG. 14 is a schematic illustration of a system for forming a multilayer composite structure according to an example.

FIG. 14 is a schematic illustration of a system 54 for forming a multilayer composite structure employing the techniques described above.

The system 54 comprises a transport unit 56, such as a plurality of driven transport rolls, to transport a sheet 58, such as the copper foil 28, to a deposition unit 60.

The deposition unit 60 may comprise a cold plasma CVD apparatus 38, 38' as described with reference to FIGS. 7 and 8 above, and may deposit pairs of graphene layers 14a, 14b on opposing first and second surface sides of the sheet 58, resulting in a coated sheet 62 with a composite structure 10 as described above with reference to FIGS. 1 and 2.

In an example, the deposition unit 60 may comprise an annealing unit, providing an annealing zone 30 upstream of the deposition growth zone as described above with reference to FIG. 5.

The transport unit 56 transports the coated sheet 62 from the deposition unit 60 to a wrapping unit 64 to wrap the coated sheet 62 into a rod 66. The wrapping unit 64 may employ any technique to wrap the coated sheet, such as rolling up the coated sheet on a thin cylindrical roll, and removing the roll.

Figure 16:
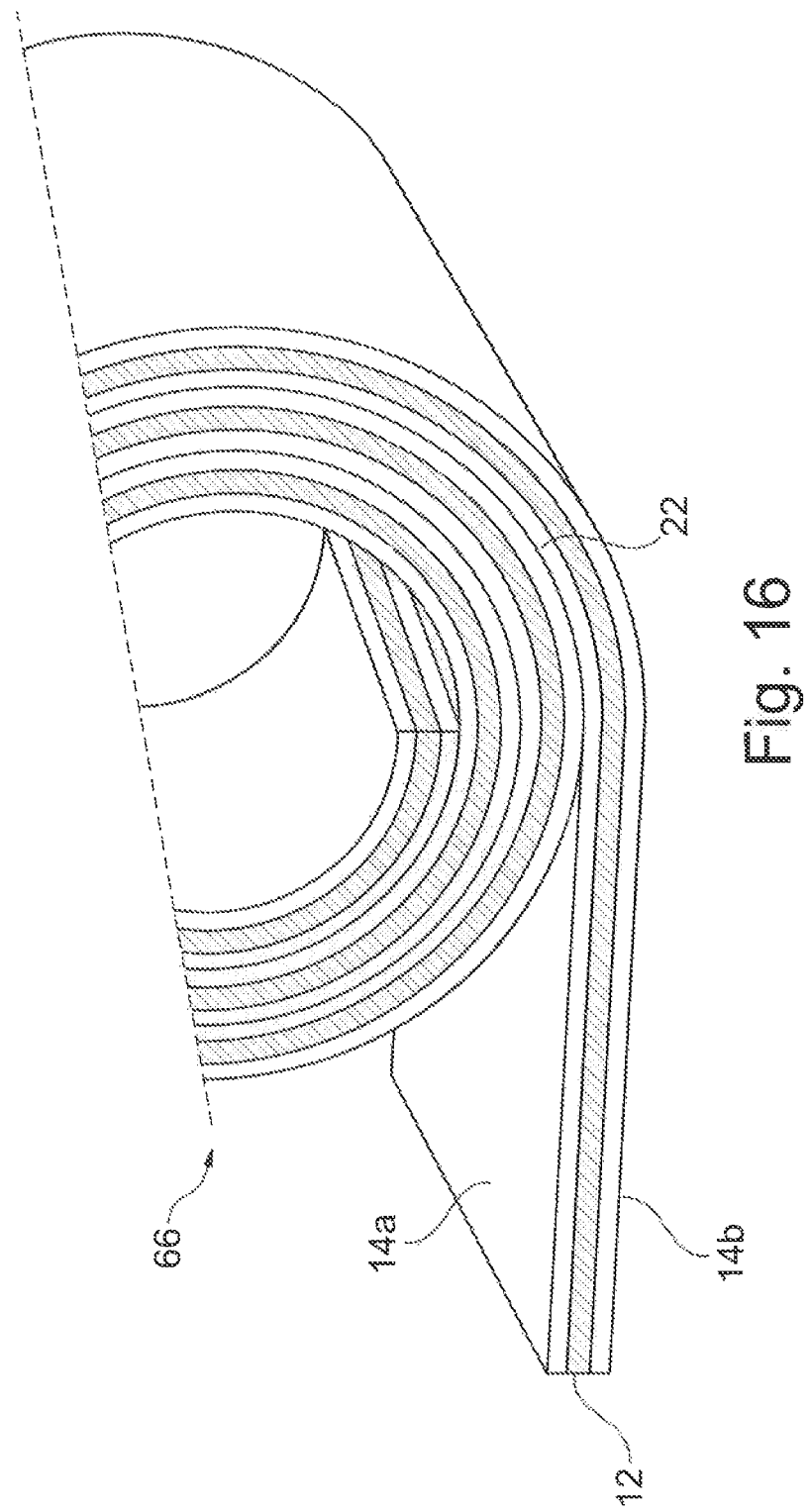
FIG. 16 illustrates a wrapped coated sheet according to an example.

The resulting rod 66 is illustrated schematically in FIG. 16. As can be taken from FIG. 16, due to the wrapping or rolling, the rod 66 comprises graphene bi-layer structures in which two graphene layers 14a, 14b are in immediate and direct contact, as described above with reference to FIG. 3, and therefore has all the conductivity advantages described above.

With further reference to FIG. 14, the transport unit 56 may transport the rod 66 to a compacting unit 68 downstream of the wrapping unit 64. The compacting unit 68 may compact the rod 66 into a compacted sheet 70.

Figure 17A:
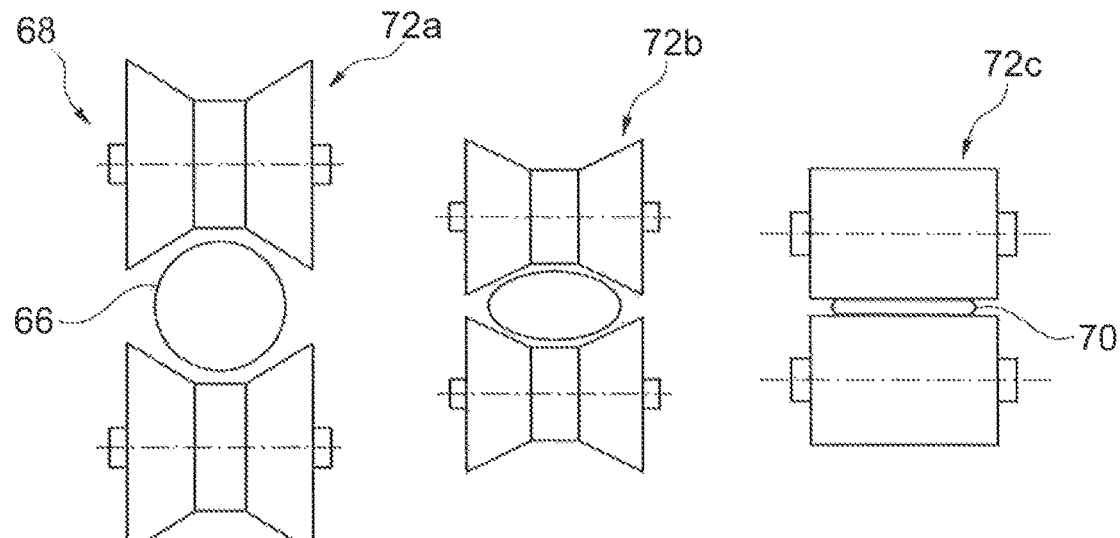
FIGS. 17a and 17b schematically illustrate a compacting unit according to an example.
Figure 17B:
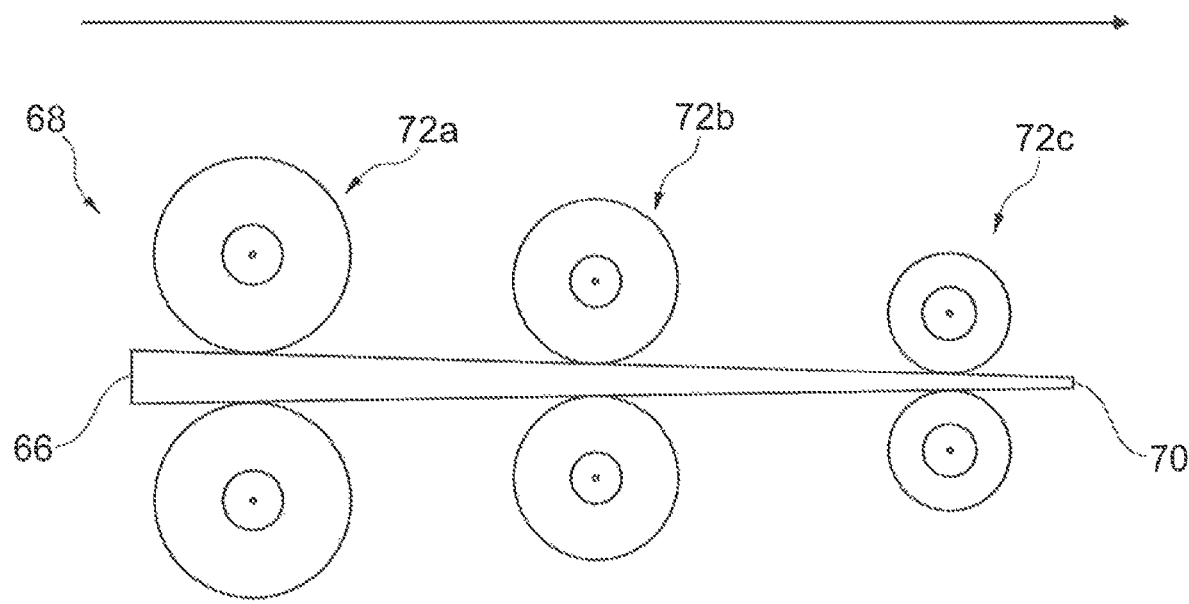

For instance, the compacting unit 68 may be a rolling press, in particular a hot rolling press, as illustrated schematically in a front view in FIG. 17a and in a side view in FIG. 17b.

As can be taken from FIGS. 17a and 17b, the hot rolling press 68 may comprise a plurality of press units 72a, 72b, 72c in a staggered configuration, so that the rod 66 passes subsequently through the press units 72a, 72 in a transport direction (illustrated by the central arrow in FIGS. 17a and 17b) and is thereby converted into the compacted sheet 70, such as a thin long band.

FIGS. 17a and 17b show a compacting unit 68 with three staggered press units 72a, 72b, 72c. However, this is for illustration only, and in other configurations the compacting unit 68 may comprise a smaller or larger number of press units.

The compacting unit 68 may further comprise a heating unit (not shown) to heat the rod 66 during the compacting. Hot rolling may provide two advantageous effects: On the one hand, it further increases the copper grain size, which leads to a reduction of the grain scattering and hence to superior electric conductivity, as described above with reference to FIGS. 9 and 10. On the other hand, hot rolling may foster the copper Cu (111) crystallographic orientation, which may increase the lattice match between the copper surface and the grown-on graphene layers, thereby providing a multilayer composite structure with enhanced mechanical properties.

For grain growth to happen effectively, the processing temperature should be sufficiently higher than the copper re-crystallization temperature of approximately 227° C. However, in order to avoid, reduce or minimize nano-cracks of the copper surface, in some examples the hot rolling temperature should be chosen below 650° C. In particular, the hot rolling temperature may be chosen between 450° C. and 550° C.

Figures 18A, 18B, 18C:
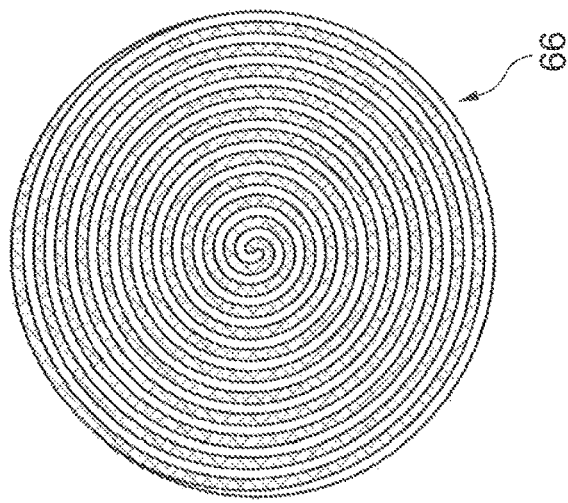
FIGS. 18a to 18c schematically illustrate the effect of compacting a wrapped coated sheet according to an example.

The sequence of FIGS. 18a to 18c show the rod 66 in a cross-sectional schematic view and its transformation into the compacted sheet 70 as it progresses through the press units 72a, 72b, 72c of the compacting unit 68.

The techniques described above take advantage of the fact that graphene layers are sort of "slippery", and generally do not stick to each other well. The reason behind this effect is that graphene has strong covalent bonding between its atoms in the horizontal direction (in-plane with the monolayers) but only relatively weak van der Waals forces in a direction vertical to the in-plane direction, which keeps it from mechanically attaching vertically to the next layer. On the other hand, because of the excellent match between the graphene lattice constant and the atomic spacing of the Cu (111) crystalline orientation, the graphene layer is strongly mechanically bonded to the copper surface on which it is grown.

Due to these reasons, graphene/copper layers can slide relatively easily with respect to each other, making the above-described conversion from a round shape of the rod 66 to a flat band 70 possible without sacrificing the excellent mechanical connection between the individual graphene layers 14a, 14b and the copper layers 12 on which they are grown. At the same time, the copper surfaces are protected by the mechanically extremely robust graphene coating, keeping any mechanical stress away from the copper during the severe plastic deformation. As illustrated in the insert of FIG. 18c, the result is a multilayer composite structure 20 corresponding to a stacking of the composite structure 10 as described above with reference to FIG. 3.

As can be further taken from FIGS. 18b and 18c, the plurality of graphene layers in the compacted sheet 70 are still interconnected with one another, which is due to the fact that the compacted sheet 70 results from compactification of the rod 66 having a single wrapped graphene layer. The connection fosters the electric conductivity in a direction perpendicular to the in-plane direction.

With further reference to FIG. 14, the system 54 additionally comprises a back-feeding unit 74 which may comprise transfer rollers to back feed the compacted sheet 70 to the deposition unit 60 for another round of chemical vapor deposition, wrapping, and compacting, as described above with reference to the circle diagram of FIG. 13.

Figure 15:
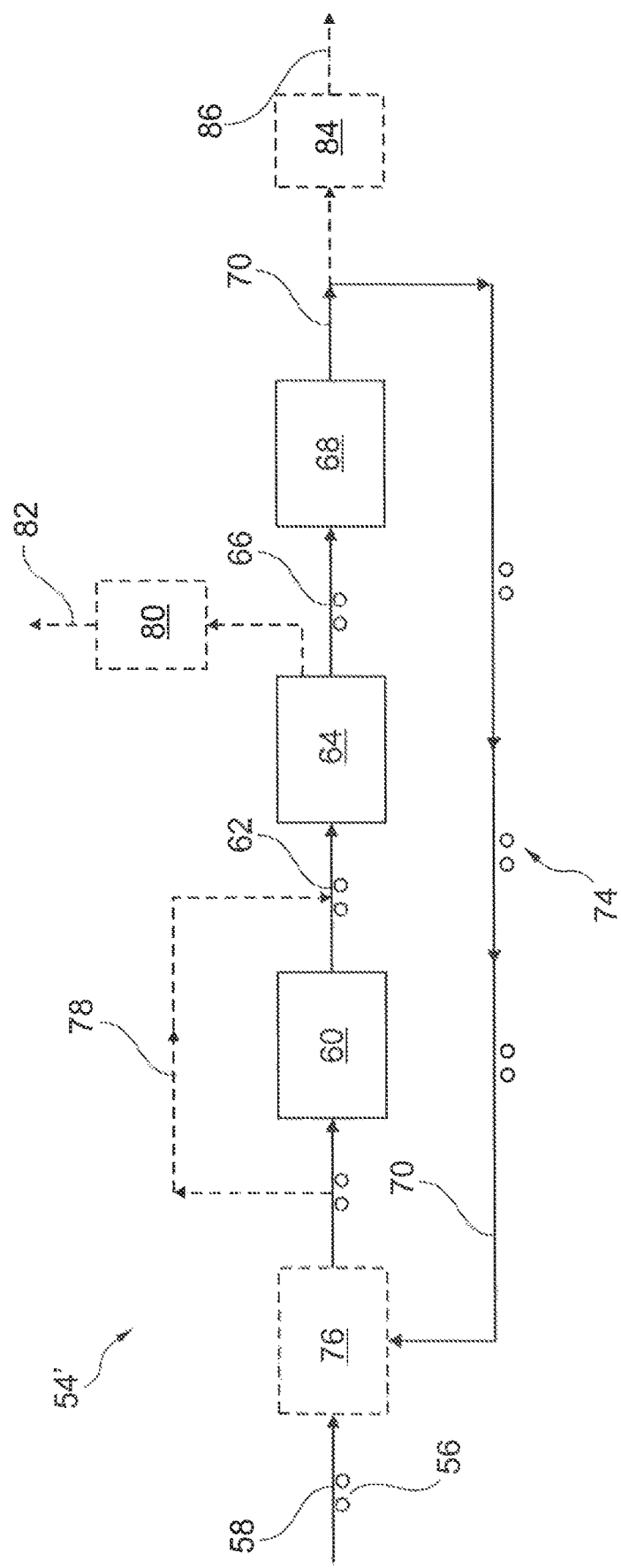
FIG. 15 is a schematic illustration of a system for forming a multilayer composite structure according to another example.

FIG. 15 is a schematic illustration of a system 54' for forming a multilayer composite structure according to another example. The system 54' is similar in design and functionality to the system 54 described with reference to FIG. 14 above, and the same reference numerals are employed to denote corresponding components. However, the system 54' comprises one or a plurality of optional units, which are illustrated in broken lines in FIG. 15.

In particular, the system 54 may comprise an etching unit 76 upstream of the deposition unit 60. The etching unit 76 may be employed to etch a first surface side and/or a second surface side of the sheet 58 and/or the back-fed compacted sheet 70 by means of chemical etching, so as to provide a pristine copper surface for a subsequent deposition in the deposition unit 60.

For instance, the etching unit 76 may comprise a quartz tube furnace, which may expose the sheet 58 to a hydrogen (70 vol.-%) and argon (30 vol.-%) gas flow at temperatures in the range of 450° C. for approximately 90 minutes. This allows to efficiently remove surface contaminants from the surfaces of the sheet 58.

As can be further taken from FIG. 15, the system 54 may alternatively or additionally comprise a bypass unit 78 configured to bypass the sheet 58 or compacted sheet 70 past the deposition unit 60.

In particular, after the circle process has reached the desired number of iterations, the resulting multilayer compacted sheet 70 may be fed back to the circle by means of the back-feeding unit 74 one last time, but skipping the graphene coating step. In particular, the bypass unit 78 may pass the compacted sheet to the wrapping unit 64 so that it does not traverse the deposition unit 60. This may ensure that in the final wrapped rod 66 produced by the wrapping unit 64, the single layers are not separated by graphene layers. In particular, this may facilitate layer fusing in a subsequent wire drawing technique in a wire-drawing system 80, as will be described in additional detail with reference to FIGS. 19 to 24 below. Wire drawing in a wire-drawing system 80 may be a final step to convert the rod 66 into a wire 82 with enhanced electrical, thermal and mechanical properties.

Alternatively, as further illustrated in FIG. 15, the system 54 may comprise a slicing unit 84 downstream of the compacting unit 68 and adapted to slice the compacted sheet 70 in a longitudinal direction into a plurality of elongated slices 86 in a final process step, after the maximum number of iterations has been reached. This may provide wires with a rectangular or square cross-section.

Wire-Drawing Method and System

As described above with reference to FIG. 15, wire drawing techniques may be employed to convert a multilayer composite rod 66 comprising the multilayer composite structure 20 into a wire.

Figure 19:
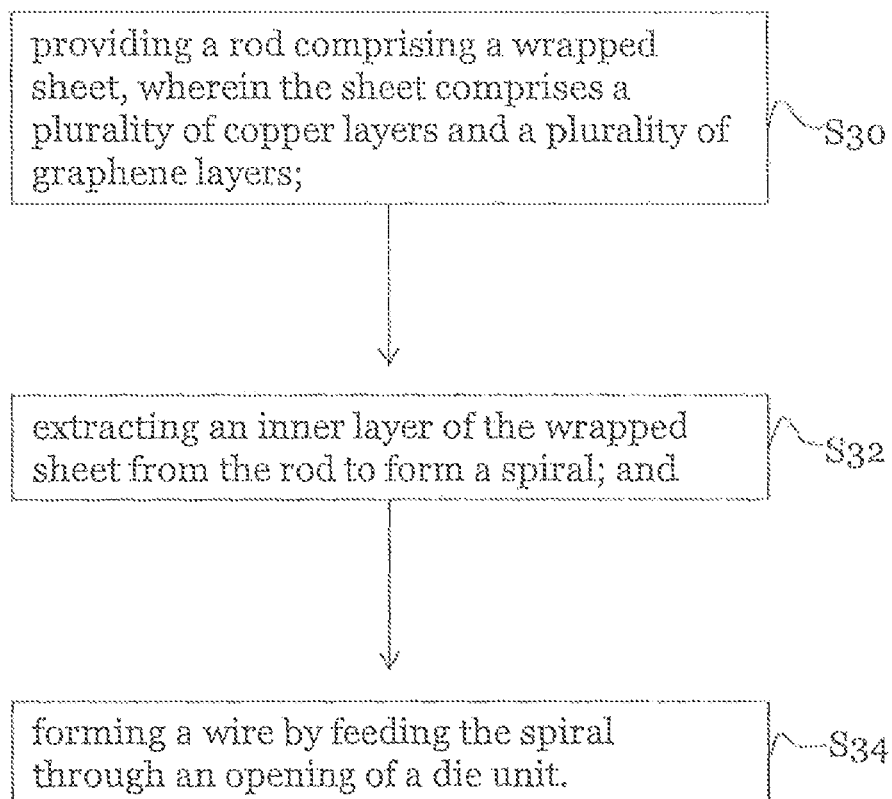
FIG. 19 is a flow diagram illustrating a wire-drawing method according to an example.

FIG. 19 is a flow diagram illustrating a wire-drawing method according to an example.

In a first step S30, a rod comprising a wrapped sheet is provided, wherein the sheet comprises a plurality of copper layers and a plurality of graphene layers.

In a second step S32, an inner layer of the wrapped sheet is extracted from the rod to form a spiral or helix.

In a third step S34, a wire is formed by feeding the spiral through an opening of a die unit.

FIG. 20 is a schematic illustration of a corresponding wire-drawing system 80 that may be configured to perform the steps of the method illustrated in the flow diagram of FIG. 19.

The wire-drawing system 80 comprises an extracting unit 88 adapted to extract an inner layer of a wrapped sheet to form a spiral, wherein the sheet comprises a plurality of copper layers and a plurality of graphene layers.

In particular, the wrapped sheet may be the rod 66 comprising the multilayer composite structure as described above with reference to FIG. 18a. The extracting unit 88 may be adapted to extract an innermost layer of the rod 66, such as by grabbing the innermost layer of the rod 66 and pulling it to form a helix or spiral 90 as illustrated in the perspective drawing of FIG. 21. In the spiral 90, each individual graphene bi-layer 22 is connected on both sides directly to the copper substrate where they are grown, so that the enhanced conductivity occurs in a largely increased volume fraction of the wire, providing for both ultra-high conductivity and high current capacity.

As described above with reference to FIG. 15, it may be beneficial that the windings of the spiral 90 do not have graphene-coating on the outside, since this might prevent them from fusing together homogeneously. In addition, a graphene-free surface provides optimum conditions for connecting the resulting wire 82 to sockets or plugs, such as by means of soldering, clamping, crimping, etc.

With additional reference to FIG. 20, the wire-drawing system 80 further comprises a feeding unit 92 downstream of the extracting unit 88, and adapted to feed the spiral 90 to a die unit 94, which converts the spiral 90 into a wire 82.

In some examples, the feeding unit 92 may comprise a pushing unit configured to push the spiral 90 towards and through the die unit 94.

In some examples, the extracting unit and the feeding unit are separate units.

In other examples, the feeding unit may be part of the extracting unit. For instance, in a configuration in which the feeding units comprises a pushing unit to push the spiral towards and through the die unit 94, the pushing may extract an inner layer of the wrapped sheet as a result of the pushing force.

FIG. 22*a* is a schematic side view of a die unit 94 as it may be used in the wire-drawing system 80. The die unit 94 comprises a plurality of dies 96*a*, 96*b*, 96*c* in a staggered configuration. Each of the dies 96*a*, 96*b*, 96*c* comprises a respective opening 98*a*, 98*b*, 98*c*, wherein a diameter or surface area of the openings 98*a*, 98*b*, 98*c* decreases in a transport direction (to the right in FIG. 22*a*) of the spiral 90 as it passes through the die unit 94. The openings 98*a*, 98*b*, 98*c* may be openings with a circular or elliptic cross-section, depending on the desired cross-section of the wire 82. The openings 98*a*, 98*b*, 98*c* may have a diameter smaller than a diameter of the rod 66 or spiral 90, but larger than the wrapped innermost layer and thereby subsequently deform the rod 66 and spiral 90 into a wire under the pulling and/or pushing force.

FIG. 22*a* further illustrates a pulling unit 100 comprising a plurality of pulling rolls 102*a*, 102*b* that pull the spiral 90 through the openings 98*a*, 98*b*, 98*c* of the die unit 94. The pulling unit 100 may form part of the feeding unit 92, or may be a separate component.

As can be further taken from FIG. 22*b*, the pulling rolls 102*a*, 102*b* may be configured to rotate or orbit around the drawn wire with a pre-selectable spacing in between to create a wire 82 with a desired outer diameter and shape.

The configuration of FIGS. 22*a* and 22*b* shows a die unit 94 with three dies 96*a*, 96*b*, 96*c* with openings of decreasing diameter in the transport direction of the spiral 90. However, in general, the die unit 94 may comprise any number of dies in a staggered configuration.

The wire-drawing techniques according to the disclosure may also be employed for additional conductivity tuning of the composite multilayer structures, as will now be described with reference to FIGS. 23 and 24.

Stacked graphene, in which at least two graphene monolayers 104*a*, 104*b* are stacked with a twist angle Θ between them, may exhibit unique electronic, thermal, and magnetic properties. A rotational twist of the graphene monolayers 104*a*, 104*b* with respect to one another can have a profound effect on the electrical properties of the bi-layer structure. Controlling the twist angle Θ of bi-layer graphene films hence allows for the preparation of twisted bi-layer graphene films with defined stacking orientations, and in turn the tailoring and fine-tuning of their electronic, thermal, and magnetic properties.

Figure 23C:
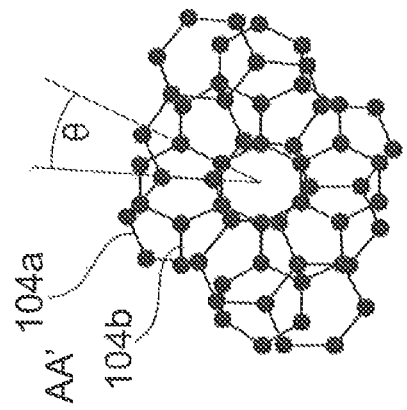
FIGS. 23a to 23c illustrate different stacking modes in bi-layer graphene structures according to an example.
Figure 23B:
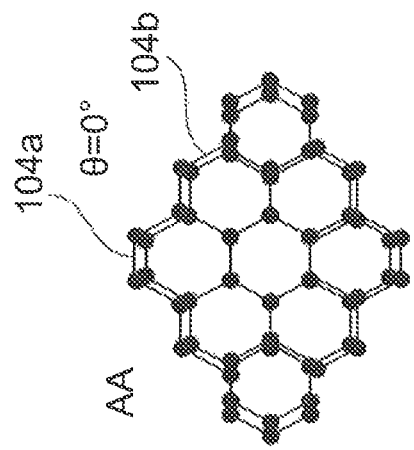
Figure 23A:
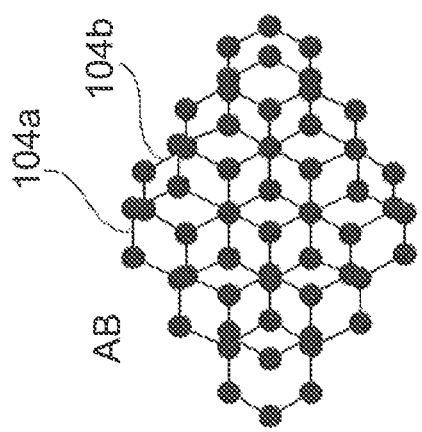

FIGS. 23*a* to 23*c* illustrate three different basic stacking modes in bi-layer graphene:

AB-stacking (also called Bernal stacking) is illustrated in FIG. 23*a*. The second graphene layer 104*b* is displaced by one half of the diameter of the hexagonal ring structure with respect to the hexagons of the first graphene layer 104*a*. This results in a parallel shift without a twist.

FIG. 23*b* schematically illustrates the so-called AA-stacking (also called non-Bernal stacking), in which the hexagons of the two layers 104*a*, 104*b* lie right on top of each other (no shift, no twist).

FIG. 23*c* illustrates AA'-stacking, which is similar to AA-stacking, but in which the crystallographic axes of the two layers 104*a*, 104*b* are twisted by an angle Θ between 0° and 60° with respect to one another (no shift, twist angle Θ).

Figure 24A:
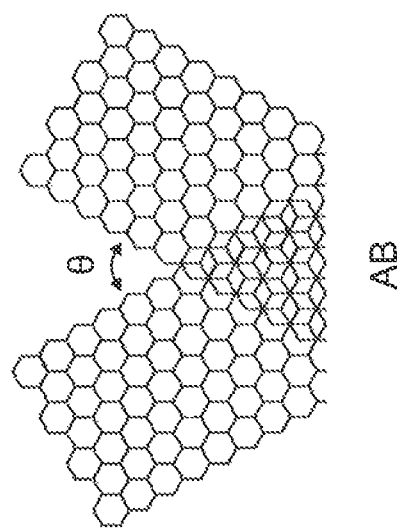
FIGS. 24a and 24b illustrate the transformation between different stacking modes of bi-layer graphene structures according to an example.
Figure 24B:
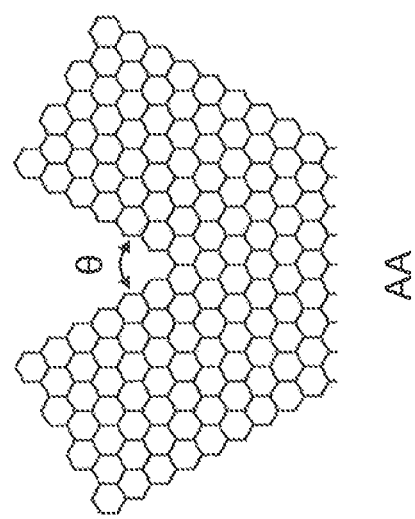

By means of twisting the layers by an angle of Θ=60°, an AB configuration can be transformed into an AA configuration and vice-versa, as illustrated in FIGS. 24*a* and 24*b*.

In order to control the electrical, thermal, and magnetic properties of a stacked copper graphene bi-layer composite material, and in particular the wire 82, the twist angle Θ between the layers 104*a*, 104*b* may be adjusted by means of a die unit 94 in which the openings 98*a*, 98*b*, 98*c* have a non-zero inclination angle with respect to a feeding direction of the spiral 90.

As illustrated in FIG. 22*a*, a main twist angle Θ may be determined by means of the inclination angle of the openings 98*a*, 98*b*, 98*c* of the die unit 94. Different openings 98*a*, 98*b*, 98*c* may have different inclination angles with respect to a feeding direction of the spiral 90, which may lead to modifications and fine-tuning of the twist angle between the individual layers of the spiral 90.

The description of the embodiments and the Figures merely serve to illustrate the techniques of the disclosure, but should not be understood to imply any limitation. The scope is to be determined on the basis of the appended claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A wire-drawing method, comprising:
providing a rod comprising a wrapped sheet, wherein the sheet comprises a plurality of copper layers and a plurality of graphene layers;
extracting an inner layer of the wrapped sheet from the rod to form a spiral; and
forming a wire by feeding the spiral through an opening of a die unit.

2. The method according to claim 1, wherein the opening has at least one of an elliptic cross section and a circular cross section.

3. The method according to claim 1, wherein the opening has an inclination angle with respect to a feeding direction of the spiral.

4. The method according to claim 3, wherein the inclination angle is larger than 5°.

5. The method according to claim 3, wherein the inclination angle is smaller than 30°.

6. The method according to claim 1, wherein forming the wire comprises:
feeding the spiral through a first opening of the die unit, and subsequently feeding the spiral through a second opening of the die unit downstream of the first opening;
wherein the second opening is smaller than the first opening.

7. The method according to claim 6, wherein a cross section of at least one of the first opening and the second opening has one of an elliptic cross section and a circular cross section.

8. The method according to claim 6, wherein the first opening has a first inclination angle with respect to a feeding direction of the spiral, and wherein the second opening has a second inclination angle with respect to a feeding direction of the spiral.

9. The method according to claim 8, wherein the first inclination angle or the second inclination angle is larger than 5°.

10. The method according to claim 8, wherein the first inclination angle or the second inclination angle is smaller than 30°.

11. The method according to claim 8, wherein the second inclination angle differs from the first inclination angle.

12. The method according to claim 1, wherein feeding the spiral comprises pulling and/or pushing the spiral through the opening.

13. The method according to claim 12, wherein feeding the spiral comprises pulling the spiral through the opening by means of a plurality of rotating pulling rolls.

14. The method according to claim 1, wherein the sheet comprises a first copper layer on a first surface side and a second copper layer on a second surface side opposite from the first surface side.

15. The method according to claim 1, wherein the sheet comprises a copper layer and first and second graphene layers sandwiching the copper layer.

16. A wire-drawing system, comprising:
a die unit comprising an opening;
an extracting unit configured to and operating to extract an inner layer of a wrapped sheet to form a spiral, wherein the sheet comprises a plurality of copper layers and a plurality of graphene layers; and
a feeding unit arranged to feed the spiral through the opening of the die unit.

17. The system according to claim 16, wherein the opening has one of an elliptic cross section and a circular cross section.

18. The system according to claim 16, wherein the opening has an inclination angle with respect to a feeding direction of the spiral.

19. The system according to claim 16, wherein die unit comprises a first opening and a second opening downstream of the first opening in a feeding direction, wherein the second opening is smaller than the first opening.

20. The system according to claim 16, wherein the feeding unit comprises a pulling unit adapted to pull the spiral through the opening.

* * * * *